US012696664B2

(12) United States Patent　　　　(10) Patent No.:　US 12,696,664 B2
Choi et al.　　　　　　　　　　　　(45) Date of Patent:　　　Jul. 28, 2026

(54) MOTHER GLASS PROTECTIVE FILM AND METHOD FOR MANUFACTURING DISPLAY DEVICE

(71) Applicant: Samsung Display Co., Ltd., Yongin-si (KR)

(72) Inventors: Kyungmin Choi, Yongin-si (KR); Hyochang Kim, Yongin-si (KR); Byeongkyu Park, Yongin-si (KR); Sunhaeng Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 528 days.

(21) Appl. No.: 18/191,769

(22) Filed: Mar. 28, 2023

(65) Prior Publication Data

US 2023/0389399 A1　　Nov. 30, 2023

(30) Foreign Application Priority Data

May 31, 2022　　(KR) ......................... 10-2022-0067167

(51) Int. Cl.
　　H10K 59/80　　　　(2023.01)
　　H10K 71/50　　　　(2023.01)
(52) U.S. Cl.
　　CPC ........... H10K 59/873 (2023.02); H10K 71/50 (2023.02)

(58) Field of Classification Search
　　CPC ............................. H10K 59/873; H10K 71/50
　　USPC ................................. 257/40, 59, 91, 99, 100
　　See application file for complete search history.

(56) References Cited

U.S. PATENT DOCUMENTS

| | | | |
|---|---|---|---|
| 10,483,098 B2 | 11/2019 | Um et al. | |
| 10,669,450 B2 | 6/2020 | Moon et al. | |
| 2018/0175323 A1* | 6/2018 | Ahn ...................... | H10K 71/851 |
| 2019/0259977 A1* | 8/2019 | Yug ...................... | H10K 77/111 |
| 2020/0150725 A1* | 5/2020 | Saitoh .................. | H10K 77/111 |
| 2020/0185641 A1* | 6/2020 | Jeong ................. | H10K 59/8791 |
| 2020/0358014 A1* | 11/2020 | Park .......................... | B32B 3/04 |

FOREIGN PATENT DOCUMENTS

| | | |
|---|---|---|
| CN | 107342373 A | 11/2017 |
| CN | 113013204 A | 6/2021 |
| KR | 10-1659239 B1 | 9/2016 |

* cited by examiner

*Primary Examiner* — Eric W Jones
(74) *Attorney, Agent, or Firm* — Womble Bond Dickinson (US) LLP

(57)　　　　　　ABSTRACT

A mother glass protective film having a plurality of cell film regions defined along a first direction, and a connection region adjacent to the plurality of cell film regions, includes: a carrier film; and a panel protective film on the carrier film, and having a first opening overlapping with at least the plurality of cell film regions.

16 Claims, 18 Drawing Sheets

MOTHER GLASS PROTECTIVE FILM AND METHOD FOR MANUFACTURING DISPLAY DEVICE

CROSS-REFERENCE TO RELATED APPLICATION

This application claims priority to and the benefit of Korean Patent Application No. 10-2022-0067167, filed on May 31, 2022, in the Korean Intellectual Property Office, the entire content of which is incorporated by reference herein.

BACKGROUND

1. Field

Aspects of embodiments of the present disclosure relate to a mother glass protective film, and a method for manufacturing a display device using the mother glass protective film.

2. Description of Related Art

Display devices include active regions that are activated according to electrical signals. The display devices may detect an input applied from the outside through the active regions, and display various images to provide information to users. Recently, various forms of display devices have been developed, and accordingly, active regions having various forms are being implemented.

The above information disclosed in this Background section is for enhancement of understanding of the background of the present disclosure, and therefore, it may contain information that does not constitute prior art.

SUMMARY

One or more embodiments of the present disclosure are directed to a mother glass protective film capable of shortening a process time and reducing costs, and a method for manufacturing a display device using the mother glass protective film.

According to one or more embodiments of the present disclosure, a mother glass protective film having a plurality of cell film regions defined along a first direction, and a connection region adjacent to the plurality of cell film regions, includes: a carrier film; and a panel protective film on the carrier film, and having a first opening overlapping with at least the plurality of cell film regions.

In an embodiment, the carrier film may cover a lower surface of the panel protective film.

In an embodiment, the first opening may extend in the first direction.

In an embodiment, the panel protective film may include a first end, and a second end spaced from the first end in the first direction, and the first opening may extend from the first end to the second end.

In an embodiment, the first opening may include a plurality of cell openings corresponding to the plurality of cell film regions, respectively, that are spaced from each other along the first direction.

In an embodiment, the first opening may have a width of 0.5 mm to 2 mm in a second direction crossing the first direction.

In an embodiment, a depth of the first opening may be equal to a thickness of the panel protective film.

In an embodiment, the carrier film and the panel protective film may each independently include at least one of polyimide or polyethylene terephthalate.

In an embodiment, the mother glass protective film may further include an adhesive layer on the panel protective film.

In an embodiment, the adhesive layer may have a second opening corresponding to the first opening.

In an embodiment, the carrier film may have a plate shape that is parallel to the first direction, and a second direction crossing the first direction.

According to one or more embodiments of the present disclosure, a mother glass protective film includes: a carrier film; a panel protective film on the carrier film, and having at least one first opening extending in a first direction; and an adhesive layer on the panel protective film, and having a second opening corresponding to the first opening.

According to one or more embodiments of the present disclosure, a method for manufacturing a display device, includes: providing a work panel including: a plurality of cell regions arranged along a first direction, each of the cell regions including a first region, a bending region, and a second region sequentially defined along a second direction crossing the first direction; and a peripheral region adjacent to the plurality of cell regions; disposing a work protective film below the work panel, the work protective film having a first opening to overlap with at least the bending region; and cutting the work panel along a cutting line between the plurality of cell regions and the peripheral region.

In an embodiment, the work protective film may include: a carrier film; and a panel protective film on the carrier film, and having the first opening.

In an embodiment, the carrier film may cover a lower surface of the panel protective film.

In an embodiment, the panel protective film may include: a first end; and a second end spaced from the first end in the first direction, and the first opening may extend from the first end to the second end.

In an embodiment, the work protective film may further include an adhesive layer on the panel protective film, and in the disposing of the work protective film, the work panel and the adhesive layer may be in contact with each other.

In an embodiment, the adhesive layer may have a second opening corresponding to the first opening.

In an embodiment, the first opening may extend in the first direction.

In an embodiment, the plurality of cell regions may be spaced from one another along the first direction and the second direction, and the first opening may include a plurality of cell openings corresponding to the plurality of cell regions, respectively.

BRIEF DESCRIPTION OF THE DRAWINGS

The above and other aspects and features of the present disclosure will be more clearly understood from the following detailed description of the illustrative, non-limiting embodiments with reference to the accompanying drawings. In the drawings:

FIG. 8A is a cross-sectional view showing a state in which a display device is unfolded according to an embodiment of the present disclosure;

DETAILED DESCRIPTION

Figure 1A:
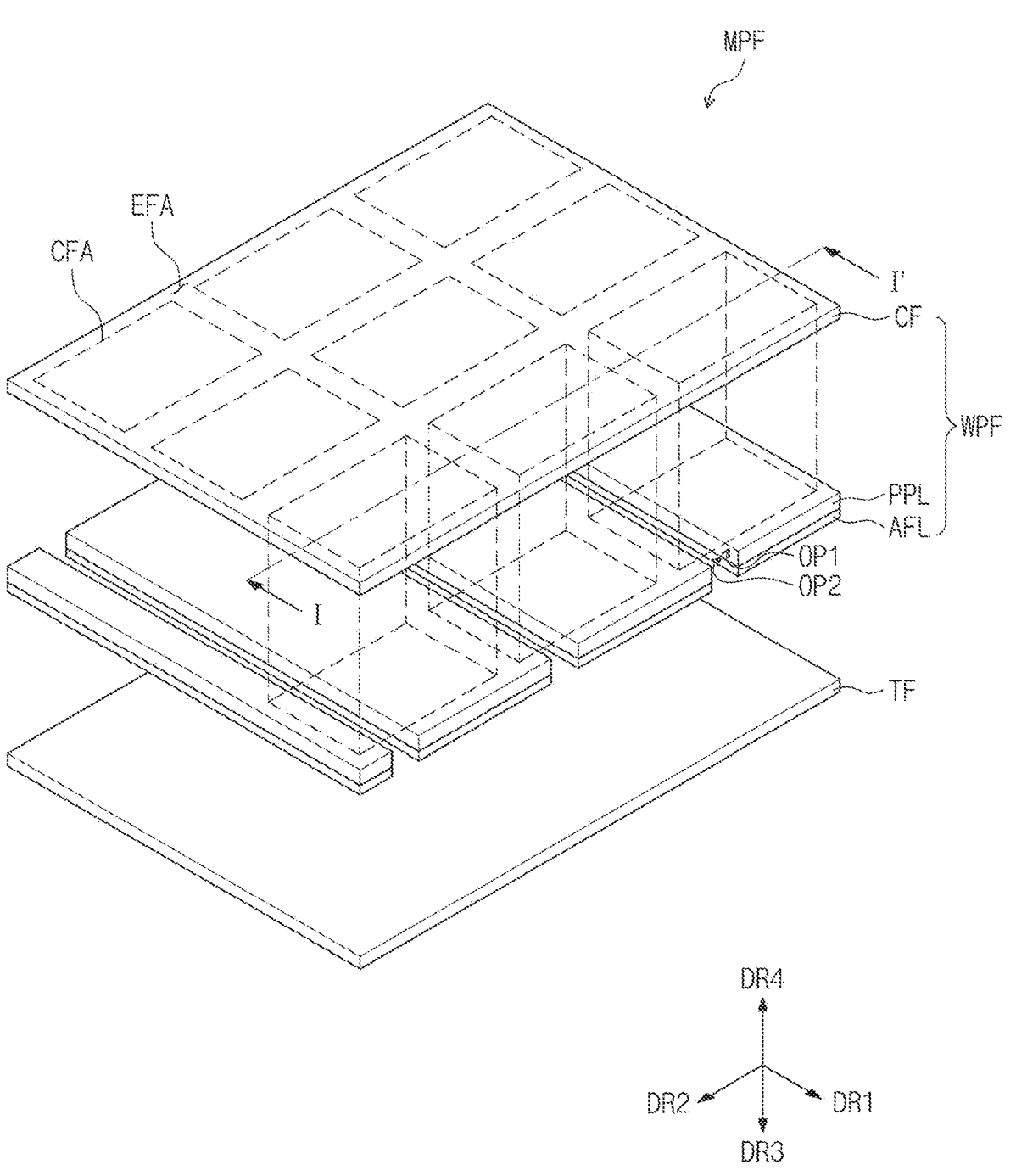
FIG. 1A is a perspective view of a mother glass protective film according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. For example, the expression "disposed directly on" may mean that two layers or two members are disposed on one another without using an additional member, such as an adhesive member, therebetween. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1B:
FIG. 1B is a cross-sectional view of a mother glass protective film according to an embodiment of the present disclosure.
Figure 1B:
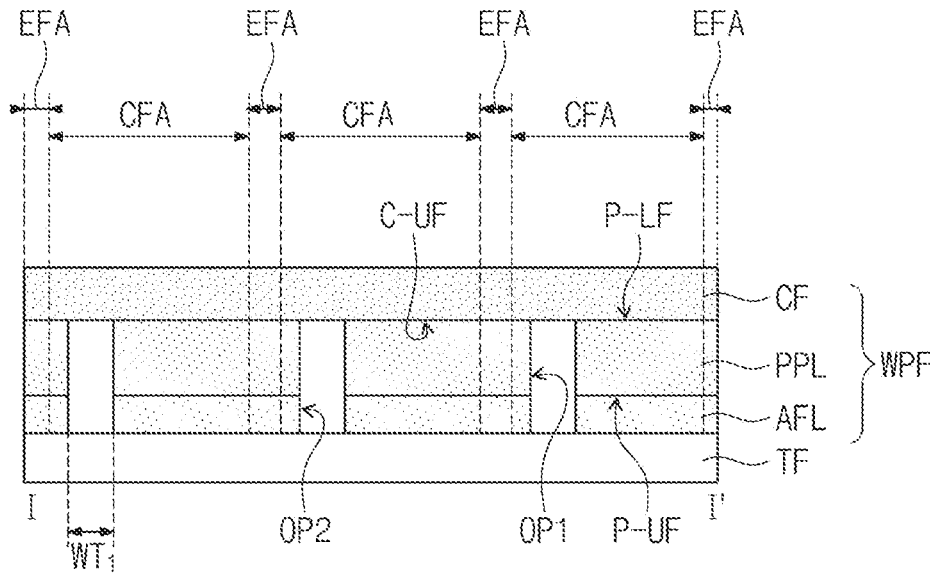
Figure 1B:
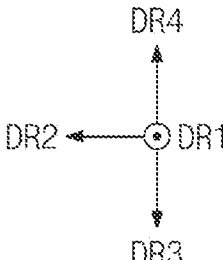

FIG. 1A is a perspective view of a mother glass protective film according to an embodiment of the present disclosure. FIG. 1B is a cross-sectional view of a mother glass protective film according to an embodiment of the present disclosure. FIG. 1B is a cross-sectional view showing a portion corresponding to the line I-I' of FIG. 1A. FIGS. 1A and 1B show a state in which a mother glass protective film MPF is vertically inverted for convenience of illustration.

The mother glass protective film MPF may include a work protective film WPF and a temporary protective film TF. The work protective film WPF may include a carrier film CF, a panel protective film PPL, and an adhesive layer AFL. The work protective film WPF may be a protective film bonded to protect a work panel WP (e.g., see FIG. 10A) in a method of manufacturing a display device, which will be described in more detail below. The temporary protective film TF is a component for protecting an adhesive surface of the adhesive layer AFL, and may be removed when the work protective film WPF is bonded to the work panel WP (e.g., see FIG. 10A). The temporary protective film TF may be omitted from the mother glass protective film MPF as needed or desired.

An upper surface of each of the components is a surface that is parallel to or substantially parallel to a plane defined by a first direction DR1 and a second direction DR2. A thickness direction of each of the components is indicated by a third direction DR3. A fourth direction DR4 indicates a direction opposite to the third direction DR3. The third direction DR3 indicates an upper direction, and the fourth direction DR4 indicates a lower direction. An upper side (or an upper portion) and a lower side (or a lower portion) of each of the components are defined by the third direction DR3 and the fourth direction DR4, respectively. As described above, for convenience of illustration, in FIGS. 1A and 1B, the third direction DR3, which is the upper direction, is shown as facing downward, and the fourth direction DR4, which is the lower direction, is shown as facing upward. However, the directions indicated by the first to fourth directions DR1, DR2, DR3 and DR4 may be relative, and thus, may be variously modified to other suitable directions as needed or desired.

The mother glass protective film MPF may include a plurality of cell film regions CFA, and a connection region EFA adjacent to the plurality of cell film regions CFA. The connection region EFA may surround (e.g., around peripheries of) the plurality of cell film regions CFA.

The plurality of cell film regions CFA may optionally correspond to a plurality of cell regions CA of the work panel WP (e.g., see FIG. 10A), which will be described in more detail below. The plurality of cell film regions CFA and the connection region EFA may be defined according to positions overlapping with the work panel WP (e.g., see FIG. 10A). The plurality of cell film regions CFA may be regions corresponding to the plurality of cell regions CA of the work panel WP, which will be described in more detail below, and the connection region EFA may correspond to a peripheral region EA of the work panel WP (e.g., see FIG. 10A). As used herein, the expression "a region/portion corresponds to another region/portion" indicates that the regions/portions at least partially overlap with each other when viewed on a plane (e.g., in a plan view), and the regions/portions are not limited to having the same size of an area as each other.

The plurality of cell film regions CFA may be arranged along the first direction DR1. The plurality of cell film regions CFA may be arranged along the first direction DR1 and the second direction DR2. In the present embodiment, the cell film regions CFA are shown as including three-by-three cell film regions that are arranged to be spaced apart from each other along each of the first direction DR1 and the second direction DR2, but the present disclosure is not limited thereto. The mother glass protective film MPF may include a greater number of cell film regions CFA, and the cell film regions CFA may be arranged along any suitable one of the first direction DR1 and/or the second direction DR2, but the present disclosure is not limited to any particular embodiment.

The carrier film CF may have a plate shape extending along the first direction DR1 and the second direction DR2. The carrier film CF may include a flexible plastic material. For example, the carrier film CF may include at least one of polyimide (PI) or polyethylene terephthalate (PET). The carrier film CF may be formed of any one of polyimide (PI) and/or polyethylene terephthalate (PET). However, the material of the carrier film CF is not limited thereto.

The panel protective film PPL may be disposed on the carrier film CF. At least one first opening OP1 may be defined in the panel protective film PPL. The panel protective film PPL may include a lower surface P-LF adjacent to the carrier film CF, and an upper surface P-UF opposite to the lower surface P-LF. The first opening OP1 may be an opening defined from the upper surface P-UF of the panel protective film PPL to the lower surface P-LF of the panel protective film PPL, as shown in FIG. 1B. In other words, the first opening OP1 may be defined to pass through (e.g., penetrate) the panel protective film PPL from the upper surface P-UF of the panel protective film PPL to the lower surface P-LF of the panel protective film PPL. Accordingly, a depth of the first opening OP1 in the third direction DR3 may be equal to or substantially equal to a thickness of the panel protective film PPL in the third direction DR3. A portion of an upper surface C-UF of the carrier film CF may be exposed by the first opening OP1.

The carrier film CF may cover the lower surface P-LF of the panel protective film PPL. The carrier film CF may entirely cover the lower surface P-LF of the panel protective film PPL. A portion of the upper surface C-UF of the carrier film CF may contact the lower surface P-LF of the panel protective film PPL.

The first opening OP1 may have a width $WT_1$ of about 0.5 mm to about 2 mm in the second direction DR2. The width $WT_1$ of the first opening OP1 may be equal to or substantially equal to a width of a bending region BA (e.g., see FIG.

5) of the display panel DP in the second direction DR2, which will be described in more detail below. However, the present disclosure is not limited thereto, and the width $WT_1$ of the first opening OP1 in the second direction DR2 may be greater than or smaller than the width of the bending region BA of the display panel DP (e.g., see FIG. 5) in the second direction DR2. As used herein, the expression "the same or substantially the same" indicates that numerical ranges, such as width and thickness, are the same or substantially the same, including a case in which numerical ranges, such as width and thickness, are physically the same, but also includes errors and variations that may generally occur upon processes.

The first opening OP1 may have a suitable shape extending in the first direction DR1. The panel protective film PPL may include one end and another end that are spaced apart from each other along the first direction DR1. The one end and the other end of the panel protective film PPL may face away from each other. The first opening OP1 may extend from the one end to the other end of the panel protective film PPL in the first direction DR1. Accordingly, a width (or length) of the first opening OP1 defined in the panel protective film PPL with respect to the first direction DR1 may be equal to or substantially equal to a width (or length) of the panel protective film PPL in the first direction DR1.

The panel protective film PPL may include a flexible plastic material. For example, the panel protective film PPL may include at least one of polyimide (PI) or polyethylene terephthalate (PET). The panel protective film PPL may be formed of any suitable one of polyimide (PI) and/or polyethylene terephthalate (PET). However, the material of the panel protective film PPL is not limited thereto.

The panel protective film PPL and the carrier film CF may include different materials from each other. However, the present disclosure is not limited thereto, and the panel protective film PPL and the carrier film CF may include the same material as each other.

The adhesive layer AFL may be disposed on the panel protective film PPL. The adhesive layer AFL may be directly disposed on the panel protective film PPL. The adhesive layer AFL may cover the upper surface P-UF of the panel protective film PPL. The adhesive layer AFL may entirely cover the upper surface P-UF of the panel protective film PPL.

At least one second opening OP2 may be defined in (e.g., may penetrate) the adhesive layer AFL. The second opening OP2 may correspond to the first opening OP1. When viewed on a plane (e.g., in a plan view), the second opening OP2 of the adhesive layer AFL may overlap with the first opening OP1 of the panel protective film PPL. The adhesive layer AFL may include a lower surface adjacent to the panel protective film PPL, and an upper surface opposite to the lower surface. The second opening OP2 may be defined to pass through (e.g., penetrate) the adhesive layer AFL from the upper surface of the adhesive layer AFL to the lower surface of the adhesive layer AFL.

The adhesive layer AFL may include a pressure sensitive adhesive (PSA) or an optically clear adhesive (OCA), but the kind of the adhesive is not limited thereto.

The mother glass protective film MPF may include the temporary protective film TF disposed on the adhesive layer AFL. The temporary protective film TF may be a release film. The temporary protective film TF may be disposed on an upper portion of the adhesive layer AFL to protect an adhesive surface of the adhesive layer AFL. The temporary protective film TF may cover the adhesive surface of the adhesive layer AFL to prevent or substantially prevent foreign substances from adhering to the adhesive surface. The mother glass protective film MPF is protected by the temporary protective film TF, and may be transferred to a manufacturing process of a display device, which will be described in more detail below. Thereafter, the temporary protective film TF may be removed in a process of disposing the work protective film WPF on the work panel WP (e.g., see FIG. 10A). However, the present disclosure is not limited thereto, and the temporary protective film TF may be omitted from the mother glass protective film MPF as needed or desired. In this case, the mother glass protective film MPF may be transferred to the manufacturing process of a display device while the upper surface of the adhesive layer AFL is exposed.

The temporary protective film TF may have a plate shape extending in the first direction DR1 and the second direction DR2. The temporary protective film TF may cover the upper surface of the adhesive layer AFL. The temporary protective film TF may be disposed on the upper surface of the adhesive layer AFL to cover the upper surface of the adhesive layer AFL. The temporary protective film TF may contact the upper surface of the adhesive layer AFL, and may cover the upper surface to prevent or substantially prevent the upper surface of the adhesive layer AFL from being exposed to the outside. As the temporary protective film TF is disposed on the upper surface of the adhesive layer AFL, the first opening OP1 and the second opening OP2 may not be exposed to the outside.

Figure 2:
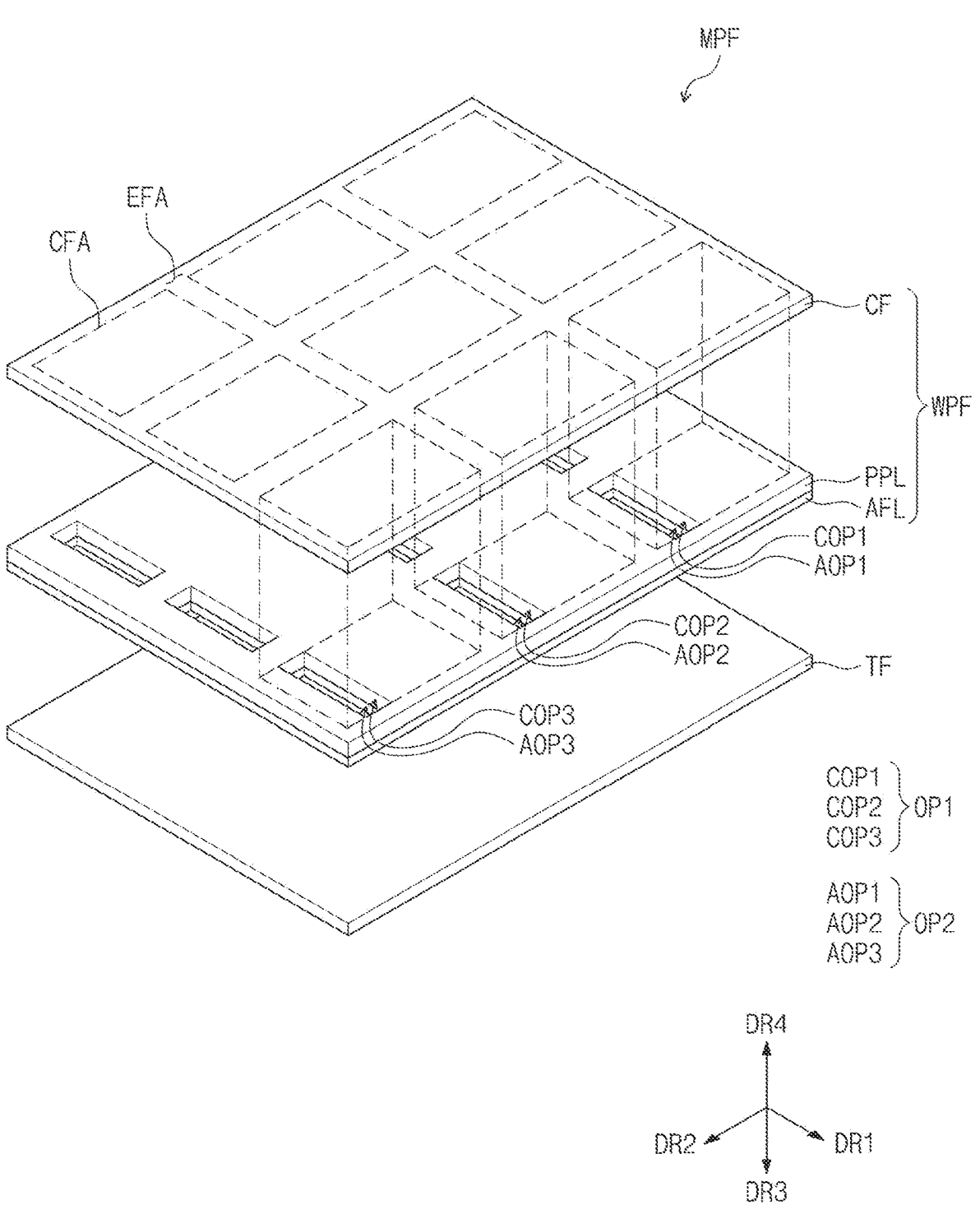
FIG. 2 is a perspective view of a mother glass protective film according to an embodiment of the present disclosure.

FIG. 2 is a perspective view of a mother glass protective film according to an embodiment of the present disclosure. The embodiment shown in FIG. 2 may be different from the embodiment shown in FIG. 1A, in that a mother glass protective film MPF shown in FIG. 2 may have a different shape of a first opening OP1 defined in a panel protective film PPL from the mother glass protective film MPF shown in FIG. 1A. In the mother glass protective film MPF shown in FIG. 2, unlike the mother glass protective film MPF shown in FIG. 1A, a plurality of cell openings COP1, COP2, and COP3 corresponding to a plurality of cell film regions CFA may be defined in (e.g., may penetrate) the panel protective film PPL.

Referring to FIG. 2, the first opening OP1 may be defined in (e.g., may penetrate) the panel protective film PPL. The first opening OP1 may include the plurality of cell openings COP1, COP2, and COP3. Each of the plurality of cell openings COP1, COP2, and COP3 may be defined to pass through (e.g., penetrate) the panel protective film PPL in the third direction DR3.

The plurality of cell openings COP1, COP2, and COP3 corresponding to the plurality of cell film regions CFA may be defined in (e.g., may penetrate) the panel protective film PPL. The plurality of cell openings COP1, COP2, and COP3 may be arranged to be spaced apart from each other along the first direction DR1 and/or the second direction DR2, and may form a uniform or substantially uniform pattern.

The plurality of cell openings COP1, COP2, and COP3 may include a plurality of first cell openings COP1, a plurality of second cell openings COP2, and a plurality of third cell openings COP3. The plurality of first cell openings COP1 may be arranged along the first direction DR1. The plurality of second cell openings COP2 may be spaced apart from the plurality of first cell openings COP1 in the second direction DR2, and arranged along the first direction DR1. The plurality of third cell openings COP3 may be spaced apart from the plurality of second cell openings COP2 in the second direction DR2, and arranged along the first direction DR1. FIG. 2 shows, as an example, the plurality of cell openings COP1, COP2, and COP3 disposed to be spaced apart from one another in a 3×3 matrix to correspond to the plurality of cell film regions CFA, but the present disclosure is not limited thereto, and the number of the plurality of cell openings COP1, COP2, and COP3 may be variously modified to correspond to the plurality of cell film regions CFA.

When viewed on a plane (e.g., in a plan view), the plurality of cell openings COP1, COP2, and COP3 may have a rectangular shape. For example, the plurality of cell openings COP1, COP2, and COP3 may have two long sides spaced apart from each other in the second direction DR2, and extending in the first direction DR1. The plurality of cell openings COP1, COP2, and COP3 may have two short sides spaced apart from each other in the first direction DR1, and extending in the second direction DR2. However, the shapes of the plurality of cell openings COP1, COP2, and COP3 are not limited thereto.

The mother glass protective film MPF may include the plurality of cell film regions CFA, and the connection region EFA adjacent to the plurality of cell film regions CFA. The connection region EFA may surround (e.g., around peripheries of) the plurality of cell film regions CFA. A portion overlapping with the plurality of cell film regions CFA and a portion overlapping with the connection region EFA in the panel protective film PPL may be referred to as a first support region. The panel protective film PPL may have a single-body plate shape through the first support region defined between the plurality of cell openings COP1, COP2, and COP3, and connecting the plurality of cell openings COP1, COP2, and COP3 to one another.

The adhesive layer AFL may be disposed on the panel protective film PPL. The adhesive layer AFL may cover an upper surface of the panel protective film PPL. A second opening OP2 may be defined in the adhesive layer AFL. The second opening OP2 may include a plurality of adhesive openings AOP1, AOP2, and AOP3. Each of the plurality of adhesive openings AOP1, AOP2, and AOP3 may be defined to pass through (e.g., penetrate) the adhesive layer AFL in the third direction DR3.

The plurality of adhesive openings AOP1, AOP2, and AOP3 corresponding to the plurality of cell film regions CFA, respectively, may be defined in (e.g., may penetrate) the adhesive layer AFL. The plurality of adhesive openings AOP1, AOP2, and AOP3 may correspond to the plurality of cell openings COP1, COP2, and COP3 of the panel protective film PPL. The plurality of adhesive openings AOP1, AOP2, and AOP3 may be arranged to be spaced apart from each other along the first direction DR1 and/or the second direction DR2, and may form a uniform or substantially uniform pattern.

The plurality of adhesive openings AOP1, AOP2, and AOP3 may include a plurality of first adhesive openings AOP1, a plurality of second adhesive openings AOP2, and a plurality of third adhesive openings AOP3. The plurality of first adhesive openings AOP1 may be arranged along the first direction DR1. The plurality of second adhesive openings AOP2 may be spaced apart from the plurality of first adhesive openings AOP1 in the second direction DR2, and arranged along the first direction DR1. The plurality of third adhesive openings AOP3 may be spaced apart from the plurality of second adhesive openings AOP2 in the second direction DR2, and arranged along the first direction DR1. FIG. 2 shows, as an example, the plurality of adhesive openings AOP1, AOP2, and AOP3 disposed to be spaced apart in a 3×3 matrix to correspond to the plurality of cell film regions CFA, but the present disclosure is not limited thereto, and the number of the plurality of adhesive openings AOP1, AOP2, and AOP3 may be variously modified to correspond to the plurality of cell film regions CFA.

When viewed on a plane (e.g., in a plan view), the plurality of adhesive openings AOP1, AOP2, and AOP3 may have a rectangular shape. For example, the plurality of adhesive openings AOP1, AOP2, and AOP3 may have two long sides spaced apart from each other in the second direction DR2, and extending in the first direction DR1. The plurality of adhesive openings AOP1, AOP2, and AOP3 may have two short sides spaced apart from each other in the first direction DR1, and extending in the second direction DR2. However, the shapes of the plurality of adhesive openings AOP1, AOP2, and AOP3 are not limited thereto.

A second support region may be defined between the plurality of adhesive openings AOP1, AOP2, and AOP3 defined in (e.g., penetrating) the adhesive layer AFL. The adhesive layer AFL may have a single-body plate shape through the second support region defined between the plurality of adhesive openings AOP1, AOP2, and AOP3, and connecting the plurality of adhesive openings AOP1, AOP2, and AOP3 to one another.

Figure 3A:
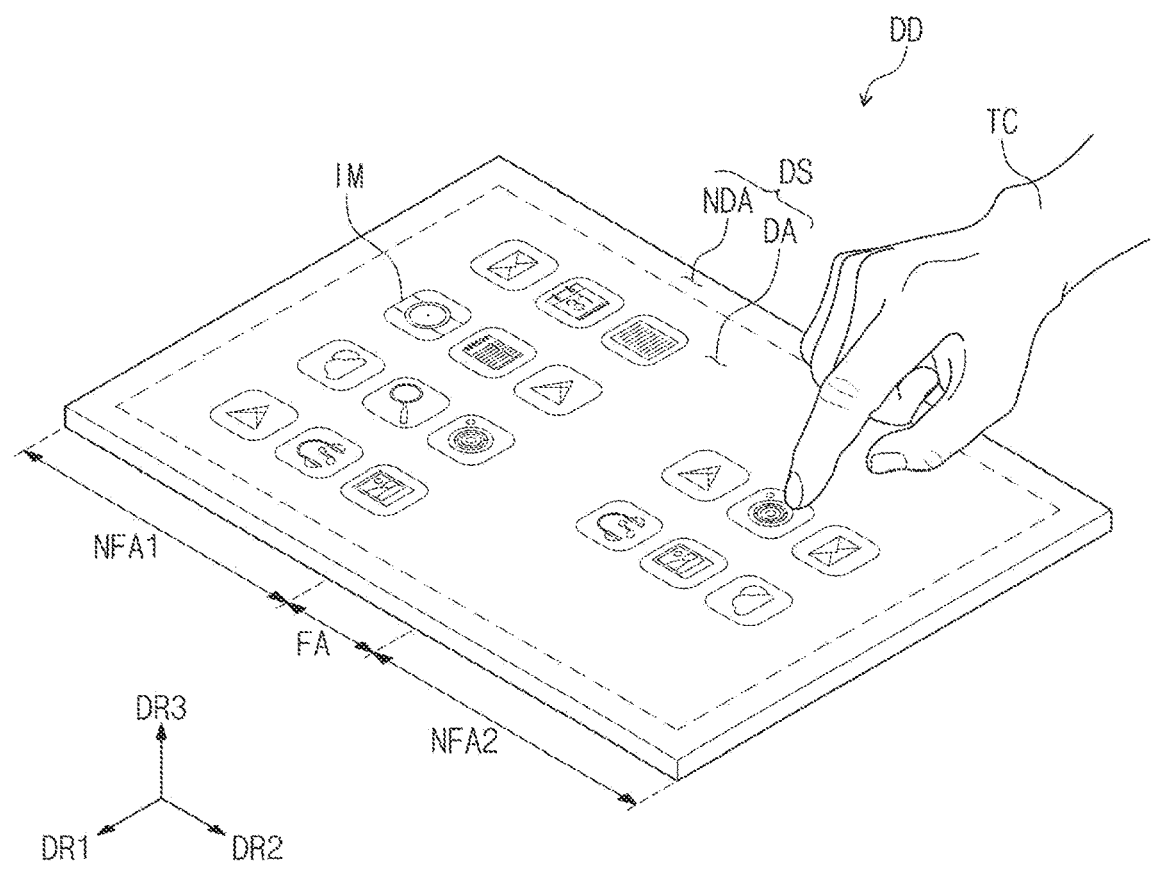
FIG. 3A is a perspective view of a display device according to an embodiment of the present disclosure.
Figure 3B:
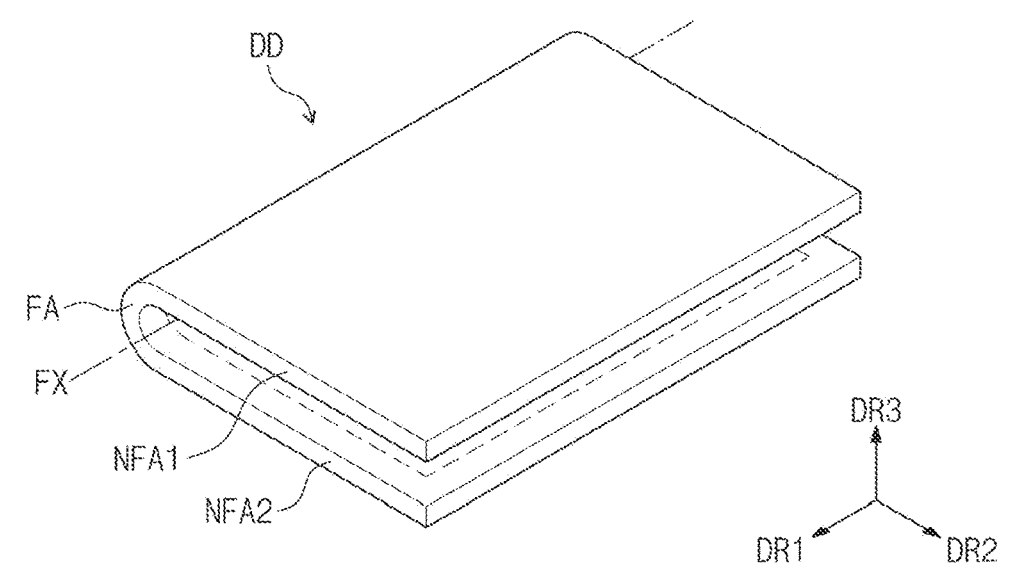
FIG. 3B is a perspective view of a display device according to an embodiment of the present disclosure.

FIG. 3A is a perspective view of a display device according to an embodiment of the present disclosure. FIG. 3B is a perspective view of a display device according to an embodiment of the present disclosure. FIG. 3A shows a state in which a display device DD is unfolded, and FIG. 3B shows a state in which the display device DD is folded.

Referring to FIG. 3A and FIG. 3B, the display device DD may be a foldable display device. The display device DD according to an embodiment of the present disclosure may be used in large scale electronic devices, such as televisions and monitors, as well as in small-to-medium scale electronic devices. such as mobile phones, tablets, car navigation systems, game consoles, and smart watches.

An upper surface of the display device DD may be defined as a display surface DS. When the display surface DS in an unfolded state, or in other words, in a state in which the display device DD is flat or substantially flat, the display surface DS may have a plane defined by the first direction DR1 and the second direction DR2. A thickness direction of the display device DD may be parallel to or substantially parallel to the third direction DR3 crossing the first direction DR1 and the second direction DR2. Therefore, a front surface (e.g., an upper surface) and a rear surface (e.g., a lower surface) of the members constituting the display device DD may be defined with respect to the third direction DR3.

The display surface DS may include a display region DA, and a non-display region NDA around (e.g., adjacent to) the display region DA. The display region DA is a region at (e.g., in or on) which an image IM is displayed, and the non-display region NDA is a region where the image IM is not displayed. FIG. 3A shows application icons as an example of the image IM.

The display region DA may have a tetragonal shape. The non-display region NDA may surround (e.g., around a periphery of) the display region DA. However, the present disclosure is not limited thereto, and the shape of the display region DA and the shape of the non-display region NDA may be variously modified as needed or desired.

The display device DD according to an embodiment of the present disclosure may sense a user input TC applied from the outside. For example, the user input TC includes various suitable kinds of external inputs, such as a contact or proximity of a portion of the user's body, light, heat, and/or pressure. In the present embodiment, the user input TC is shown as a part (e.g., a finger) of a user's hand applied to the front surface. However, the present disclosure is not limited thereto, and as described above, the user input TC may be provided in various suitable forms (e.g., an input using a user's hand, an input using a device such as a touch pen, a stylus pen, or the like). In addition, the display device DD may sense the user input TC applied to a side surface or a bottom surface of the display device DD, depending on a desired structure of the display device DD, and is not limited to any particular embodiment.

The display device DD may activate the display surface DS to display the image IM, and to sense the external input TC. In the present embodiment, a region for sensing the external input TC is shown to be provided at (e.g., in or on) the display region DA where the image IM is displayed. However, the present disclosure is not limited thereto, and the region for sensing the external input TC may be provided at (e.g., in or on) the non-display region NDA and/or the entire region of the display surface DS.

In the display device DD, a first non-folding region NFA1, a folding region FA, and a second non-folding region NFA2 may be sequentially defined along the second direction DR2. In other words, the folding region FA may be defined between the first non-folding region NFA1 and the second non-folding region NFA2. A single folding region FA and two first and second non-folding regions NFA1 and NFA2 are shown in FIGS. 3A and 3B, but the number of the folding regions FA and the number of the first and second non-folding regions NFA1 and NFA2 are not limited thereto. For example, the display device DD may include more than two non-folding regions, and a plurality of folding regions disposed between the non-folding regions.

The display device DD may be folded with respect to a folding axis FX. In other words, the folding region FA may be bent with respect to the folding axis FX. The folding axis FX may extend in the first direction DR1. The folding axis FX may be defined as a minor axis that is parallel to or substantially parallel to a short side of the display device DD.

When the display device DD is folded, a display surface of the first non-folding region NFA1 and a display surface of the second non-folding region NFA2 may face each other. Thus, the display surface DS may not be exposed to the outside in a folded state. However, the present disclosure is not limited thereto. In an embodiment of the present disclosure, when the display device DD is folded, the display surface of the first non-folding region NFA1 and the display surface of the second non-folding region NFA2 may be opposite to each other. Thus, the display surface DS may be exposed to the outside in the folded state.

Figure 4A:
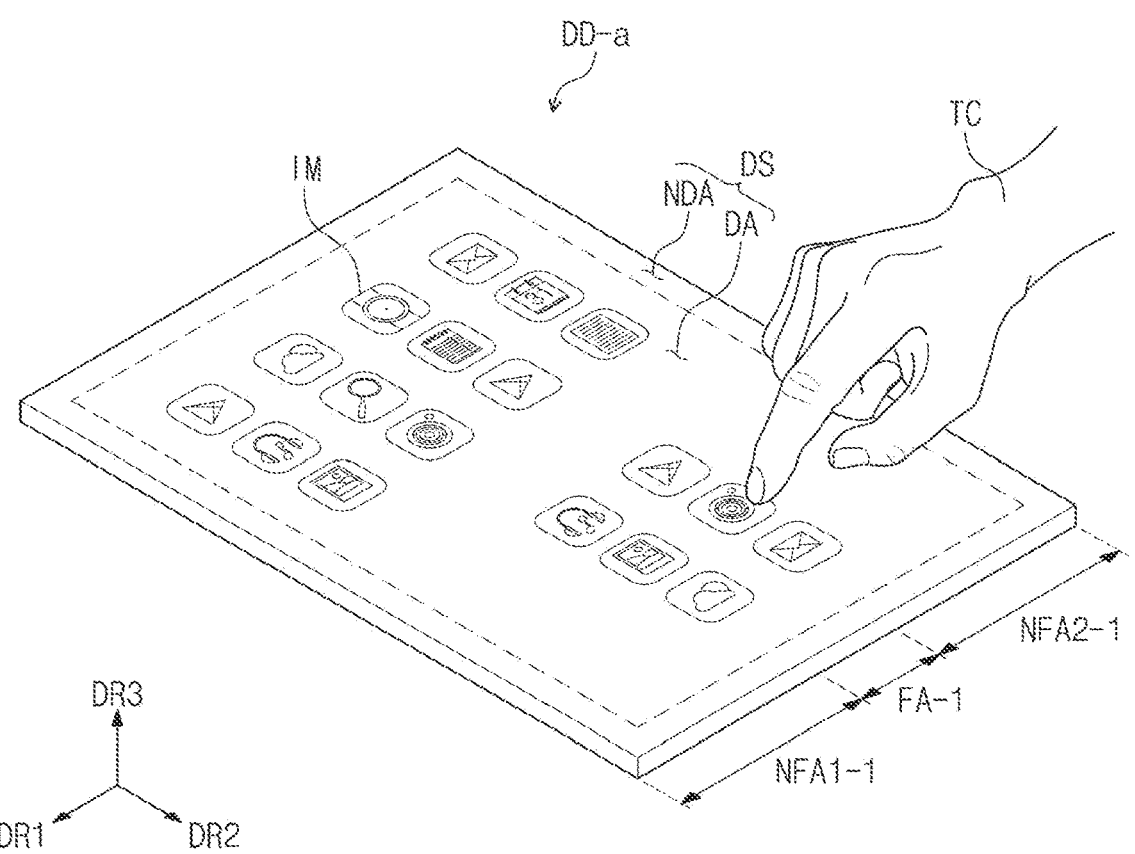
FIG. 4A is a perspective view of a display device according to an embodiment of the present disclosure.
Figure 4B:
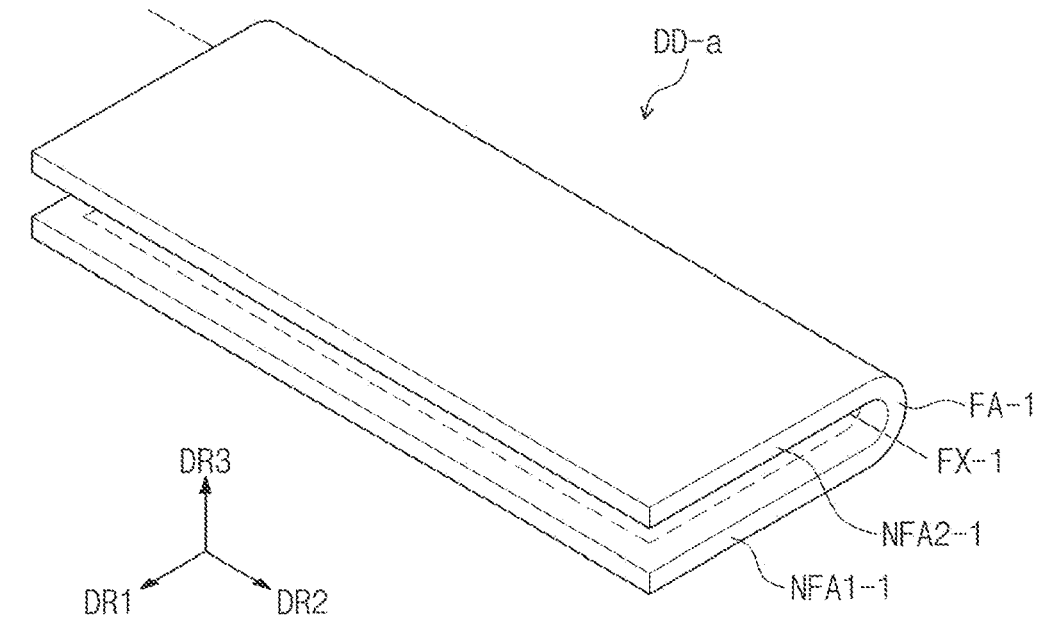
FIG. 4B is a perspective view of a display device according to an embodiment of the present disclosure.

FIG. 4A is a perspective view of a display device according to an embodiment of the present disclosure. FIG. 4B is a perspective view of a display device according to an embodiment of the present disclosure. FIG. 4A shows a state in which a display device DD-a is unfolded, and FIG. 4B shows a state in which the display device DD-a is folded.

Referring to FIG. 4A and FIG. 4B, in the display device DD-a, a first non-folding region NFA1-1, a folding region FA-1, and a second non-folding region NFA2-1 may be sequentially defined along the first direction DR1. The folding region FA-1 may be defined between the first non-folding region NFA1-1 and the second non-folding region NFA2-1.

The display device DD-a may be folded with respect to a folding axis FX-1. In other words, the folding region FA-1 may be bent with respect to the folding axis FX-1. The folding axis FX-1 may extend in the second direction DR2.

The folding axis FX-1 may be defined as a major axis that is parallel to or substantially parallel to a long side of the display device DD-a.

Hereinafter, for convenience, a structure of the display device DD that is folded with respect to a minor axis will be described in more detail. However, the present disclosure is not limited thereto, and the structures described hereinafter may be also applied to the display device DD-a that is folded with respect to the major axis.

Figure 5:
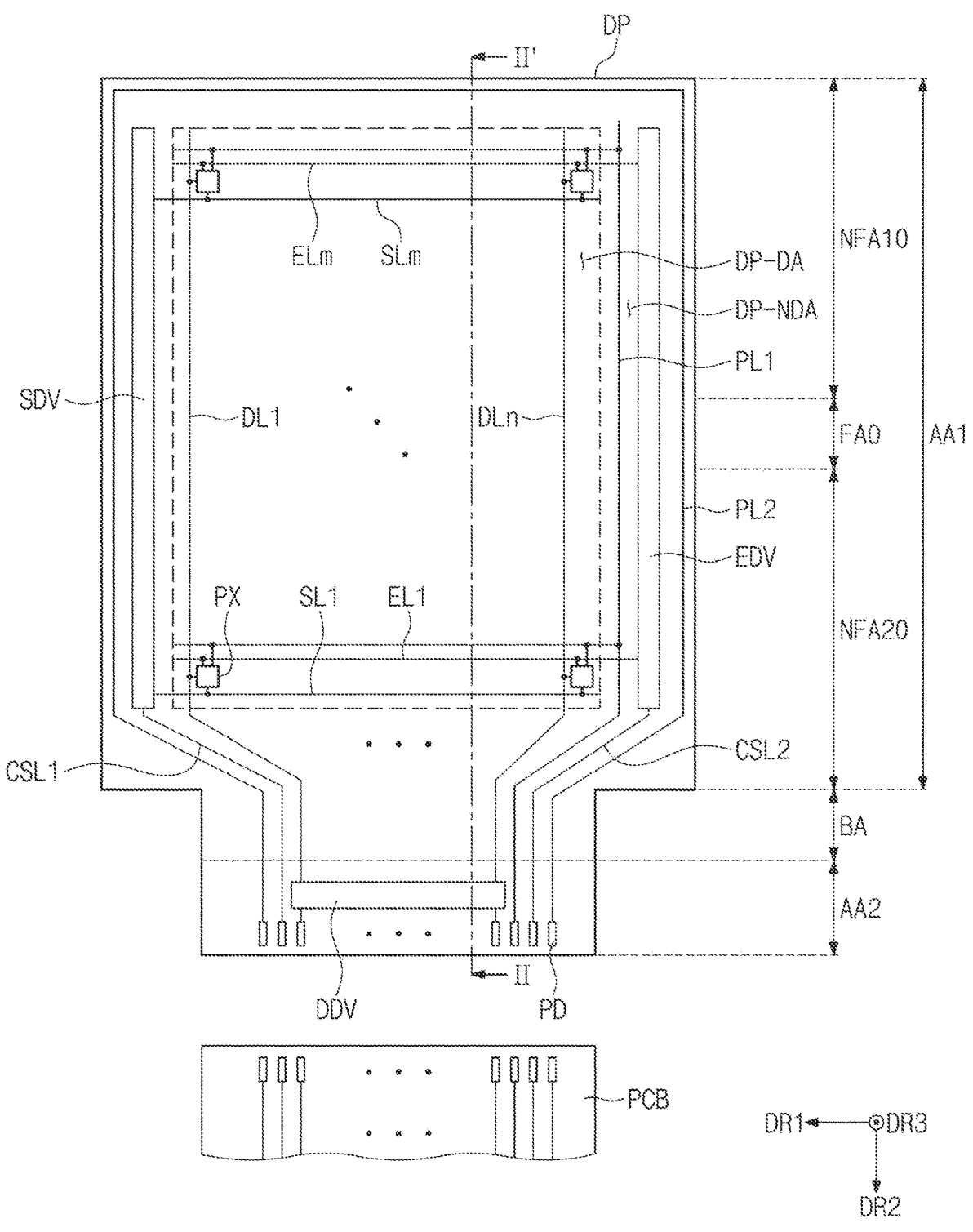
FIG. 5 is a plan view of a display panel according to an embodiment of the present disclosure.
Figure 6:
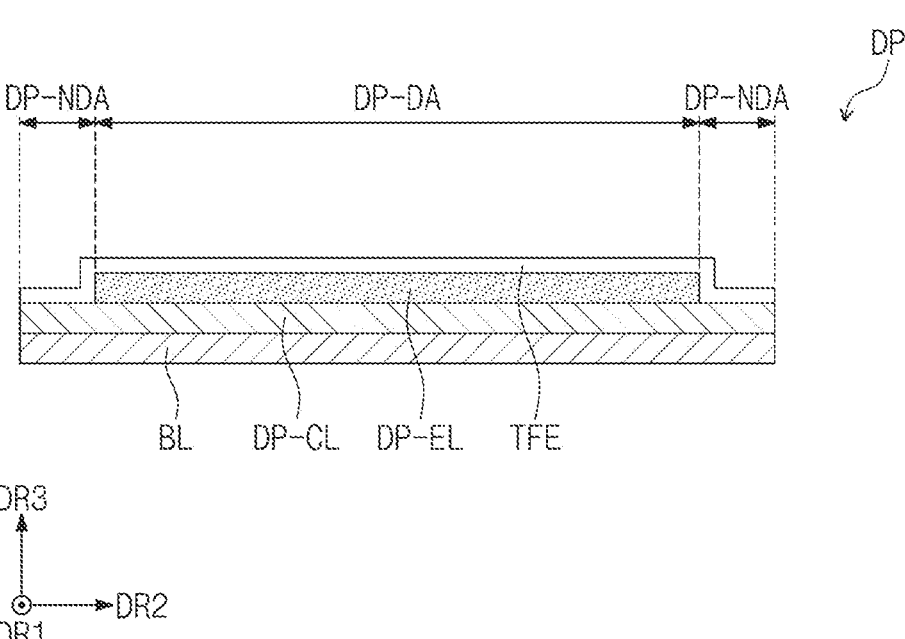
FIG. 6 is a cross-sectional view of a display panel according to an embodiment of the present disclosure.

FIG. 5 is a plan view of a display panel according to an embodiment of the present disclosure. FIG. 6 is a cross-sectional view of a display panel according to an embodiment of the present disclosure.

The display panel DP according to an embodiment of the present disclosure may be a light emitting display panel, but is not particularly limited thereto. For example, the display panel DP may be an organic light emitting display panel or a quantum-dot light emitting display panel. An emission layer of the organic light emitting display panel may include an organic light emitting material. An emission layer of the quantum dot light emitting display panel may include quantum dots, quantum rods, and/or the like. Hereinafter, for convenience, the display panel DP may be described in more detail in the context of an organic light emitting display panel, but the present disclosure is not limited thereto.

Referring to FIG. 5, the display panel DP may include a display region DP-DA, and a non-display region DP-NDA around (e.g., adjacent to) the display region DP-DA. The display region DP-DA and the non-display region DP-NDA are defined with respect to the presence or absence of pixels PX. The display region DP-DA and the non-display region DP-NDA correspond to the display region DA and the non-display region NDA, respectively, of the display device DD of FIG. 3A. A scan driver SDV, a driving circuit DDV, and an emission driver EDV may be disposed at (e.g., in or on) the non-display region DP-NDA.

The display panel DP includes a first region AA1, a second region AA2, and a bending region BA, which are arranged along the second direction DR2. When a final display device DD is unfolded as shown in FIG. 3A, the first region AA1 and the second region AA2 of the display panel DP mounted on the display device DD are disposed at (e.g., in or on) different planes from each other. This is shown in more detail in FIG. 8B. The bending region BA is disposed between the first region AA1 and the second region AA2. A bending shape of the bending region BA will be described in more detail below with reference to FIG. 8B. FIG. 5 shows an unfolded state of the display panel DP before being mounted on the display device DD.

The first region AA1 is a region corresponding to the display surface DS of FIG. 3A. The first region AA1 may include a first non-folding region NFA10, a second non-folding region NFA20, and a folding region FA0. The first non-folding region NFA10, the second non-folding region NFA20, and the folding region FA0 correspond to the first non-folding region NFA1, the second non-folding region NFA2, and the folding region FA, respectively, of FIG. 3A.

A width of the bending region BA and a width of the second region AA2 in the first direction DR1 may each be smaller than a width of the first region AA1 in the first direction DR1. The second region AA2 and the bending region BA may be a portion of the non-display region DP-NDA.

The display panel DP may include a plurality of pixels PX, a plurality of scan lines SL1 to SLm, a plurality of data lines DL1 to DLn, a plurality of emission lines EL1 to ELm, first and second control lines CSL1 and CSL2, a first power line PL1, a second power line PL2, and a plurality of pads PD. In this case, m and n are each a natural number of 2 or more. The pixels PX may be connected to the scan lines SL1 to SLm, the data lines DL1 to DLn, and the emission lines EL1 to ELm.

The driving circuit DDV may be disposed in the second region AA2. The driving circuit DDV may be an integrated circuit chip. The scan lines SL1 to SLm may extend in the first direction DR1, and may be connected to the scan driver SDV. The data lines DL1 to DLn may extend in the second direction DR2, and may be connected to the driving circuit DDV via the bending region BA. The emission lines EL1 to ELm may extend in the second direction DR2, and may be connected to the emission driver EDV.

The first power line PL1 may include a portion extending in the first direction DR1, and a portion extending in the second direction DR2. The portion extending in the first direction DR1 and the portion extending in the second direction DR2 may be disposed at (e.g., in or on) different layers from each other. The portion of the first power line PL1 extending in the second direction DR2 may extend to the second region AA2 via the being region BA. The first power line PL1 may provide a first voltage to the pixels PX.

The second power line PL2 may be disposed at (e.g., in or on) the non-display region DP-NDA along an edge of the first region AA1. The second power line PL2 may be disposed to be farther outside than the scan driver SDV and the emission driver EDV.

The first control line CSL1 is connected to the scan driver SDV, and may extend toward a lower end of the second region AA2 via the bending region BA. The second control line CSL2 is connected to the emission driver EDV, and may extend toward the lower end of the second region AA2 via the bending region BA.

When viewed on a plane (e.g., in a plan view), the pads PD may be disposed to be adjacent to the lower end of the second region AA2. The driving circuit DDV, the first power line PL1, the second power line PL2, the first control line CSL1, and the second control line CSL2 may be connected to the pads PD. A printed circuit board PCB may be electrically connected to the pads PD through an anisotropic conductive adhesive layer.

The pixels PX each include a light emitting element, and a pixel driving circuit that controls a light emission of the light emitting element. The pixel driving circuit includes a plurality of transistors, and at least one capacitor.

Referring to FIG. 6, the display panel DP may include a base layer BL, a circuit element layer DP-CL disposed on the base layer BL, a light emitting element layer DP-EL disposed on the circuit element layer DP-CL, and a thin film encapsulation layer TFE disposed on the light emitting element layer DP-EL.

The base layer BL may include a synthetic resin film. For example, the base layer BL may include polyimide (PI). The base layer BL may have a multilayered structure. The base layer BL may include a first synthetic resin film, at least one inorganic layer disposed on the first synthetic resin film, and a second synthetic resin film disposed on the inorganic layer. The first synthetic resin film and the second synthetic resin film may be polyimide films.

The circuit element layer DP-CL may include an organic layer, an inorganic layer, a semiconductor pattern, a conductive pattern, a signal line, and the like. The organic layer, the inorganic layer, a semiconductor layer, and a conductive layer may be formed on the base layer BL through a suitable method, such as coating and/or deposition. Thereafter, the organic layer, the inorganic layer, the semiconductor layer, and the conductive layer may be selectively patterned multiple times through a photolithography process to form the semiconductor pattern, the conductive pattern, and the signal line.

The semiconductor pattern, the conductive pattern, and the signal line may form the pixel driving circuits of the pixels PX described above with reference to FIG. 5, and the signal lines SL1 to SLm, DL1 to DLn, EL1 to ELm, CSL1, CSL2, PL1, and PL2. The pixel driving circuit may include at least one transistor.

The light emitting element layer DP-EL includes a light emitting element of each of the pixels PX described above with reference to FIG. 5. The light emitting element is electrically connected to the at least one transistor. In addition, the light emitting element layer DP-EL may further include at least one of an organic layer or an inorganic layer.

The thin film encapsulation layer TFE may be disposed on the circuit element layer DP-CL to cover the light emitting element layer DP-EL. The thin film encapsulation layer TFE may include an inorganic layer, an organic layer, and an inorganic layer, which are sequentially stacked. The stacked structure of the thin film encapsulation layer TFE is not particularly limited thereto.

A planar shape of the base layer BL is the same or substantially the same as the planar shape of the display panel DP shown in FIG. 5. The base layer BL is disposed at (e.g., in or on) the display region DP-DA and the non-display region DP-NDA.

The pixel driving circuit of the circuit element layer DP-CL is disposed at (e.g., in or on) the display region DP-DA. In addition, some of the signal lines SL1 to SLm, DL1 to DLn, EL1 to ELm, CSL1, CSL2, PL1, and PL2 of the circuit element layer DP-CL are disposed at (e.g., in or on) the display region DP-DA and the non-display region DP-NDA.

The light emitting element of the light emitting element layer DP-EL is disposed at (e.g., in or on) the display region DP-DA. The thin film encapsulation layer TFE is disposed at (e.g., in or on) the display region DP-DA and the non-display region DP-NDA. However, the thin film encapsulation layer TFE may not fully cover the non-display region DP-NDA, and it may be sufficient for the thin film encapsulation layer TFE to cover the display region DP-DA.

Figure 7:
FIG. 7 is a cross-sectional view showing some components of a display device according to an embodiment of the present disclosure.

FIG. 7 is a cross-sectional view showing some components of a display device according to an embodiment of the present disclosure. In FIG. 7, for convenience of illustration, the components corresponding to one pixel of a display panel DP, an input sensor IS, an anti-reflection layer LF, and a shock absorbing layer DMP of the display device DD are shown in more detail.

FIG. 7 shows one light emitting element LD, and a pixel circuit PC including a silicon transistor S-TFT and an oxide transistor O-TFT. At least one of a plurality of transistors included in the pixel circuit PC may be an oxide transistor O-TFT, and other remaining transistors thereof may each be a silicon transistor S-TFT.

A buffer layer BFL may be disposed on the base layer BL. The buffer layer BFL may prevent or substantially prevent diffusion of metal atoms and/or impurities from the base layer BL into an upper first semiconductor pattern SP1. The first semiconductor pattern SP1 includes an active region AC1 of the silicon transistor S-TFT. In addition, the buffer layer BFL may control a heat supply rate upon a crystallization process for forming the first semiconductor pattern SP1, and thus, the first semiconductor pattern SP1 may be uniformly or substantially uniformly formed.

A first rear metal layer BMLa may be disposed below the silicon transistor S-TFT, and a second rear metal layer BMLb may be disposed below the oxide transistor O-TFT. The first and second rear metal layers BMLa and BMLb may be disposed to overlap with the pixel circuit PC. The first and second rear metal layers BMLa and BMLb may block external light from reaching the pixel circuit PC.

The first rear metal layer BMLa may be disposed to correspond to at least a portion of the pixel circuit PC. The first rear metal layer BMLa may be disposed to overlap with a driving transistor implemented as the silicon transistor S-TFT.

The first rear metal layer BMLa may be disposed between the base layer BL and the buffer layer BFL. In an embodiment of the present disclosure, an inorganic barrier layer may be further disposed between the first rear metal layer BMLa and the buffer layer BFL. The first rear metal layer BMLa may be connected to an electrode or a line, and may receive a constant or substantially constant voltage or a signal therefrom. According to an embodiment of the present disclosure, the first rear metal layer BMLa may be a floating electrode that is isolated from other electrodes or lines.

The second rear metal layer BMLb may be disposed to correspond to a lower portion of the oxide transistor O-TFT. The second rear metal layer BMLb may be disposed between a second insulating layer IL2 and a third insulating layer IL3. The second rear metal layer BMLb may be disposed at (e.g., in or on) the same layer as that of a second electrode CE20 of a storage capacitor Cst. The second rear metal layer BMLb may be connected to a contact electrode BML2-C to receive a constant or substantially constant voltage or a signal. The contact electrode BML2-C may be disposed at (e.g., in or on) the same layer as that of a gate GT2 of the oxide transistor O-TFT.

The first rear metal layer BMLa and the second rear metal layer BMLb may each include a reflective metal. For example, the first rear metal layer BMLa and the second rear metal layer BMLb may each include silver (Ag), a silver-containing alloy, molybdenum (Mo), a molybdenum-containing alloy, aluminum (Al), an aluminum-containing alloy, aluminum nitride (AlN), tungsten (W), tungsten nitride (WN), copper (Cu), and/or a p+ doped amorphous silicon. The first rear metal layer BMLa and the second rear metal layer BMLb may include the same or substantially the same material as each other, or different materials from each other.

According to an embodiment of the present disclosure, the second rear metal layer BMLb may be omitted as needed or desired. For example, in this case, the first rear metal layer BMLa may extend to a lower portion of the oxide transistor O-TFT, and thus, the first rear metal layer BMLa may block light incident to the lower portion of the oxide transistor O-TFT.

The first semiconductor pattern SP1 may be disposed on the buffer layer BFL. The first semiconductor pattern SP1 may include a silicon semiconductor. For example, the silicon semiconductor may include amorphous silicon, polycrystalline silicon, or the like. For example, the first semiconductor pattern SP1 may include low-temperature polysilicon.

FIG. 7 shows a portion of the first semiconductor pattern SP1 that is disposed on the buffer layer BFL, and the first semiconductor pattern SP1 may be further disposed at (e.g., in or on) another region. The first semiconductor pattern SP1 may be arranged in a suitable rule (e.g., a predetermined or specific rule) across the pixels PX. The first semiconductor pattern SP1 may have different electrical properties according to whether or not it is doped. The first semiconductor pattern SP1 may include a first region having a high conductivity, and a second region having a low conductivity. The first region may be doped with an N-type dopant or a P-type dopant. A P-type transistor may include a doped region doped with the P-type dopant, and a N-type transistor may include a doped region doped with the N-type dopant. The second region may be a non-doped region, or may be doped in a lower concentration than that of the first region.

The first region has greater conductivity than that of the second region, and may serve or substantially serve as an electrode or a signal line. The second region may correspond to or substantially correspond to an active region (e.g., a channel) of the transistor. In other words, a portion of the first semiconductor pattern SP1 may be an active region of the transistor, another portion may be a source or drain of the transistor, and another portion may be a connection electrode or a connection signal line.

A source region SE1 (e.g., a source), an active region AC1 (e.g., a channel), and a drain region DE1 (e.g., a drain) of the silicon transistor S-TFT may be formed from the first semiconductor pattern SP1. The source region SE1 and the drain region DE1 may extend in opposite directions from the active region AC1 in a cross section.

A first insulating layer IL1 may be disposed on the buffer layer BFL. The first insulating layer IL1 may commonly overlap with a plurality of the pixels PX, and may cover the first semiconductor pattern SP1. The first insulating layer IL1 may be an inorganic layer and/or an organic layer, and may have a single-layer structure or a multi-layered structure. The first insulating layer IL1 may include at least one of aluminum oxide, titanium oxide, silicon oxide, silicon nitride, silicon oxynitride, zirconium oxide, or hafnium oxide. In the present embodiment, the first insulating layer IL1 may be a single layer of a silicon oxide layer. An insulating layer of the circuit element layer DP-CL, which will be described in more detail below, in addition to the first insulating layer IL1, may be an inorganic layer and/or an organic layer, and may have single-layer structure or a multi-layered structure. The inorganic layer may include at least one of the materials described above, but is not limited thereto.

A gate GT1 of the silicon transistor S-TFT is disposed on the first insulating layer IL1. The gate GT1 may be a portion of a metal pattern. The gate GT1 overlaps with the active region AC1. In the process of doping the first semiconductor pattern SP1, the gate GT1 may serve as a mask. The gate GT1 may include titanium (Ti), silver (Ag), a silver-containing alloy, molybdenum (Mo), a molybdenum-containing alloy, aluminum (Al), an aluminum-containing alloy, aluminum nitride (AlN), tungsten (W), tungsten nitride (WN), copper (Cu), indium tin oxide (ITO), indium zinc oxide (IZO), and/or the like, but is not particularly limited thereto.

A second insulating layer IL2 may be disposed on the first insulating layer IL1, and may cover the gate GT1. A third insulating layer IL3 may be disposed on the second insulating layer IL2. The second electrode CE20 of the storage capacitor Cst may be disposed between the second insulating layer IL2 and the third insulating layer IL3. In addition, a first electrode CE10 of the storage capacitor Cst may be disposed between the first insulating layer IL1 and the second insulating layer IL2.

A second semiconductor pattern SP2 may be disposed on the third insulating layer IL3. The second semiconductor pattern SP2 may include an active region AC2 of the oxide transistor O-TFT, which will be described in more detail below. The second semiconductor pattern SP2 may include an oxide semiconductor. The second semiconductor pattern SP2 may include a transparent conductive oxide, such as indium tin oxide (ITO), indium zinc oxide (IZO), indium gallium zinc oxide (IGZO), zinc oxide (ZnO), or indium oxide ($In_2O_3$).

The oxide semiconductor may include a plurality of regions that are divided according to whether or not transparent conductive oxides are reduced. A region in which the transparent conductive oxide is reduced (hereinafter, referred to as a reduction region) has a greater conductivity than that of a region in which the transparent conductive oxide is not reduced (hereinafter, referred to as a non-reduction region). The reduction region serves or substantially serves as a source/drain or a signal line of a transistor. The non-reduction region corresponds to or substantially corresponds to a semiconductor region (e.g., an active region or a channel) of the transistor. In other words, a portion of the second semiconductor pattern SP2 may be a semiconductor region of the transistor, another partial region may be a source region/drain region of the transistor, and another region may be a signal transmission region.

A source region SE2 (e.g., a source), an active region AC2 (e.g., a channel), and a drain region DE2 (e.g., a drain) of the oxide transistor O-TFT may be formed from the second semiconductor pattern SP2. The source region SE2 and the drain region DE2 may extend in opposite directions from the active region AC2 in a cross section.

A fourth insulating layer IL4 may be disposed on the third insulating layer IL3. As shown in FIG. 7, the fourth insulating layer IL4 may be an insulation pattern overlapping with the gate GT2 of the oxide transistor O-TFT, and may expose the source region SE2 and the drain region DE2 of the oxide transistor O-TFT. As shown in FIG. 7, the fourth insulating layer IL4 may cover the second semiconductor pattern SP2.

As shown in FIG. 7, the gate GT2 of the oxide transistor O-TFT is disposed on the fourth insulating layer IL4. The gate GT2 of the oxide transistor O-TFT may be a portion of a metal pattern. The gate GT2 of the oxide transistor O-TFT overlaps with the active region AC2.

A fifth insulating layer IL5 may be disposed on the fourth insulating layer IL4, and may cover the gate GT2. A first connection electrode CNE1 may be disposed on the fifth insulating layer IL5. The first connection electrode CNE1 may be connected to the drain region DE1 of the silicon transistor S-TFT through a contact hole passing through (e.g., penetrating) the first to fifth insulating layers IL1, IL2, IL3, IL4, and IL5.

A sixth insulating layer IL6 may be disposed on the fifth insulating layer IL5. A second connection electrode CNE2 may be disposed on the sixth insulating layer IL6. The second electrode CNE2 may be connected to the first connection electrode CNE1 through a contact hole passing through (e.g., penetrating) the sixth insulating layer IL6. A seventh insulating layer IL7 may be disposed on the sixth insulating layer IL6, and may cover the second connection electrode CNE2. An eighth insulating layer IL8 may be disposed on the seventh insulating layer IL7.

The sixth insulating layer IL6, the seventh insulating layer IL7, and the eighth insulating layer IL8 may each be an organic layer. For example, the sixth insulating layer IL6, the seventh insulating layer IL7, and the eighth insulating layer IL8 may each include benzocyclobutene (BCB), polyimide, hexamethyldisiloxane (HMDSO), a general polymer, such as polymethylmethacrylate (PMMA) or polystyrene (PS), a polymer derivative having a phenolic group, an acrylic polymer, an imide-based polymer, an aryl ether polymer, an amide-based polymer, a fluorine-based polymer, a p-xylene-based polymer, a vinyl alcohol polymer, and/or a suitable blend thereof.

The light emitting element LD may include a first electrode AE, an emission layer EL, and a second electrode CE. The second electrode CE may be provided in common on a plurality of light emitting elements LD.

The first electrode AE of the light emitting element LD may be disposed on the eighth insulating layer IL8. The first electrode AE of the light emitting element LD may be a (semi)light-transmitting electrode or a reflective electrode. In an embodiment of the present disclosure, the first electrode AE of the light emitting element LD may include a reflective layer formed of Ag, Mg, Al, Pt, Pd, Au, Ni, Nd, Ir, Cr, or a suitable compound thereof, and a transparent or semi-transparent electrode layer formed on the reflective layer. The transparent or semi-transparent electrode may include at least one selected from the group consisting of indium tin oxide (ITO), indium zinc oxide (IZO), indium gallium zinc oxide (IGZO), zinc oxide (ZnO), indium oxide ($In_2O_3$), and aluminum-doped zinc oxide (AZO). For example, the first electrode AE of the light emitting element LD may include a stacked structure of ITO/Ag/ITO.

A pixel defining film PDL may be disposed on the eighth insulating layer IL8. The pixel defining film PDL may have light absorption properties, and for example, the pixel defining film PDL may be black in color. The pixel defining film PDL may include a black coloring agent. The black coloring agent may include a black dye and/or a black pigment. The black coloring agent may include carbon black, a suitable metal such as chromium, or an oxide thereof. The pixel defining film PDL may correspond to a light blocking pattern having light blocking properties.

The pixel defining film PDL may cover a portion of the first electrode AE of the light emitting element LD. For example, an opening PDL-OP exposing a portion of the first electrode AE of the light emitting element LD may be defined in (e.g., may penetrate) the pixel defining film PDL. The pixel defining film PDL may increase a distance between an edge of the first electrode AE and the second electrode CE in the light emitting element LD. Accordingly, the pixel defining film PDL may serve to prevent or substantially prevent an arc from being caused at the edge of the first electrode AE.

In some embodiments, a hole control layer may be disposed between the first electrode AE and the emission layer EL. The hole control layer may include a hole transport layer, and may further include a hole injection layer. An electron control layer may be disposed between the emission layer EL and the second electrode CE. The electron control layer may include an electron transport layer, and may further include an electron injection layer. The hole control layer and the electron control layer may be commonly formed in the plurality of pixels PX (e.g., see FIG. 5) using an open mask.

The encapsulation layer TFE may be disposed on the light emitting element layer DP-EL. The encapsulation layer TFE may include an inorganic layer TFE1, an organic layer TFE2, and an inorganic layer TFE3, which are sequentially stacked, but the layers forming the encapsulation layer TFE are not limited thereto.

The inorganic layers TFE1 and TFE3 may protect the light emitting element layer DP-EL from moisture and oxygen, and the organic layer TFE2 may protect the light emitting element layer DP-EL from foreign substances, such as dust particles. The inorganic layers TFE1 and TFE3 may include a silicon nitride layer, a silicon oxy nitride layer, a silicon oxide layer, a titanium oxide layer, or an aluminum oxide layer. The organic layer TFE2 may include an acryl-based organic layer, but the present disclosure is not limited thereto.

The input sensor IS may be disposed on the display panel DP. The input sensor IS may be referred to as a sensor, an input sensing layer, or an input sensing panel. The input sensor IS may include a sensor base layer 210, a first conductive layer 220, a sensing insulating layer 230, and a second conductive layer 240.

The sensor base layer 210 may be directly disposed on the display panel DP. The sensor base layer 210 may be an inorganic layer including at least any one from among silicon nitride, silicon oxynitride, and/or silicon oxide. As another example, the sensor base layer 210 may be an organic layer including an epoxy resin, an acrylic resin, or an imide-based resin. The sensor base layer 210 may have a single-layer structure or may have a multi-layered structure that is stacked along the third direction DR3.

The first conductive layer 220 and the second conductive layer 240 each may have a single-layer structure or may have a multi-layered structure that is stacked along the third direction DR3. The first conductive layer 220 and the second conductive layer 240 may include conductive lines that define a sensing electrode in the form of a mesh. The conductive lines may not overlap with the opening PDL-OP, and may overlap with the pixel defining film PDL.

The single-layer conductive layer may include a metal layer or a transparent conductive layer. The metal layer may include molybdenum, silver, titanium, copper, aluminum, or a suitable alloy thereof. The transparent conductive layer may include a transparent conductive oxide, such as indium tin oxide (ITO), indium zinc oxide (IZO), zinc oxide (ZnO), or indium zinc tin oxide (IZTO). In addition, the transparent conductive layer may include a conductive polymer such as PEDOT, a metal nanowire, graphene, and/or the like.

The conductive layer having a multi-layered structure may include metal layers that are sequentially staked. The metal layers may have a three-layered structure of, for example, titanium/aluminum/titanium. The multi-layered conductive layer may include at least one metal layer, and at least one transparent conductive layer.

The sensing insulating layer 230 may be disposed between the first conductive layer 220 and the second conductive layer 240. The sensing insulating layer 230 may include an inorganic film. The inorganic film may include at least one of aluminum oxide, titanium oxide, silicon oxide, silicon nitride, silicon oxynitride, zirconium oxide, or hafnium oxide.

As another example, the sensing insulating layer 230 may include an organic film. The organic film may include at least any one of an acrylic-based resin, a methacrylate-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

The anti-reflection layer LF may be disposed on the input sensor IS. The anti-reflection layer LF may include a partition layer 310, a plurality of color filters 320, and a planarization layer 330.

A material constituting the partition layer 310 is not particularly limited, as long as the material absorbs light. The partition layer 310 is a layer that may be black in color, and in an embodiment, the partition layer 310 may include a black coloring agent. The black coloring agent may include a black dye and/or a black pigment. The black coloring agent may include carbon black, a suitable metal such as chromium, or an oxide thereof.

The partition layer 310 may cover the second conductive layer 240 of the input sensor IS. The partition layer 310 may prevent or substantially prevent a reflection of external light by the second conductive layer 240. In a portion of a display module DM (e.g., see FIG. 8A), the partition layer 310 may be omitted. A region where the partition layer 310 is omitted and is not arranged may have a higher transmittance than other regions.

An opening 310-OP may be defined in the partition layer 310. The opening 310-OP may overlap with the first electrode AE of the light emitting element LD. Any one of the plurality of color filters 320 may overlap with the first electrode AE of the light emitting element LD. Any one of the plurality of color filters 320 may cover the opening 310-OP. Each of the plurality of color filters 320 may contact the partition layer 310.

The planarization layer 330 may cover the partition layer 310 and the plurality of color filters 320. The planarization layer 330 may include an organic material, and may provide a flat or substantially flat surface at an upper surface of the planarization layer 330. In an embodiment of the present disclosure, the planarization layer 330 may be omitted as needed or desired.

The shock absorbing layer DMP may be disposed on the display panel DP. In more detail, the shock absorbing layer DMP may be disposed on the anti-reflection layer LF. The shock absorbing layer DMP may include a multi-layered structure or a single-layer structure. For example, the shock absorbing layer DMP may be a single-layer structure.

The shock absorbing layer DMP may include a polymer. For example, the shock absorbing layer DMP may include polyimide, polycarbonate, polyamide, triacetylcellulose, polymethylmethacrylate, or polyethylene terephthalate.

The shock absorbing layer DMP may absorb external shocks applied to the front surface of the display device DD. In more detail, the shock absorbing layer DMP may serve to prevent or substantially prevent a deformation of the display panel DP. For example, the shock absorbing layer DMP may increase resistance to shocks caused by nail pressure or a pen. Accordingly, defects, such as bright spots, may be prevented or substantially prevented from occurring in the display panel DP.

The display device DD according to one or more embodiments of the present disclosure may include a plurality of color filters 320 in the anti-reflection layer LF instead of a polarizing film. The shock absorbing layer DMP may compensate for a decrease in an impact strength of the display device DD when the polarizing film is not included, thereby increasing the impact strength. The display device DD according to one or more embodiments of the present disclosure may include the plurality of color filters 320 and the shock absorbing layer DMP to maintain or substantially maintain excellent impact resistance.

Figure 8A:
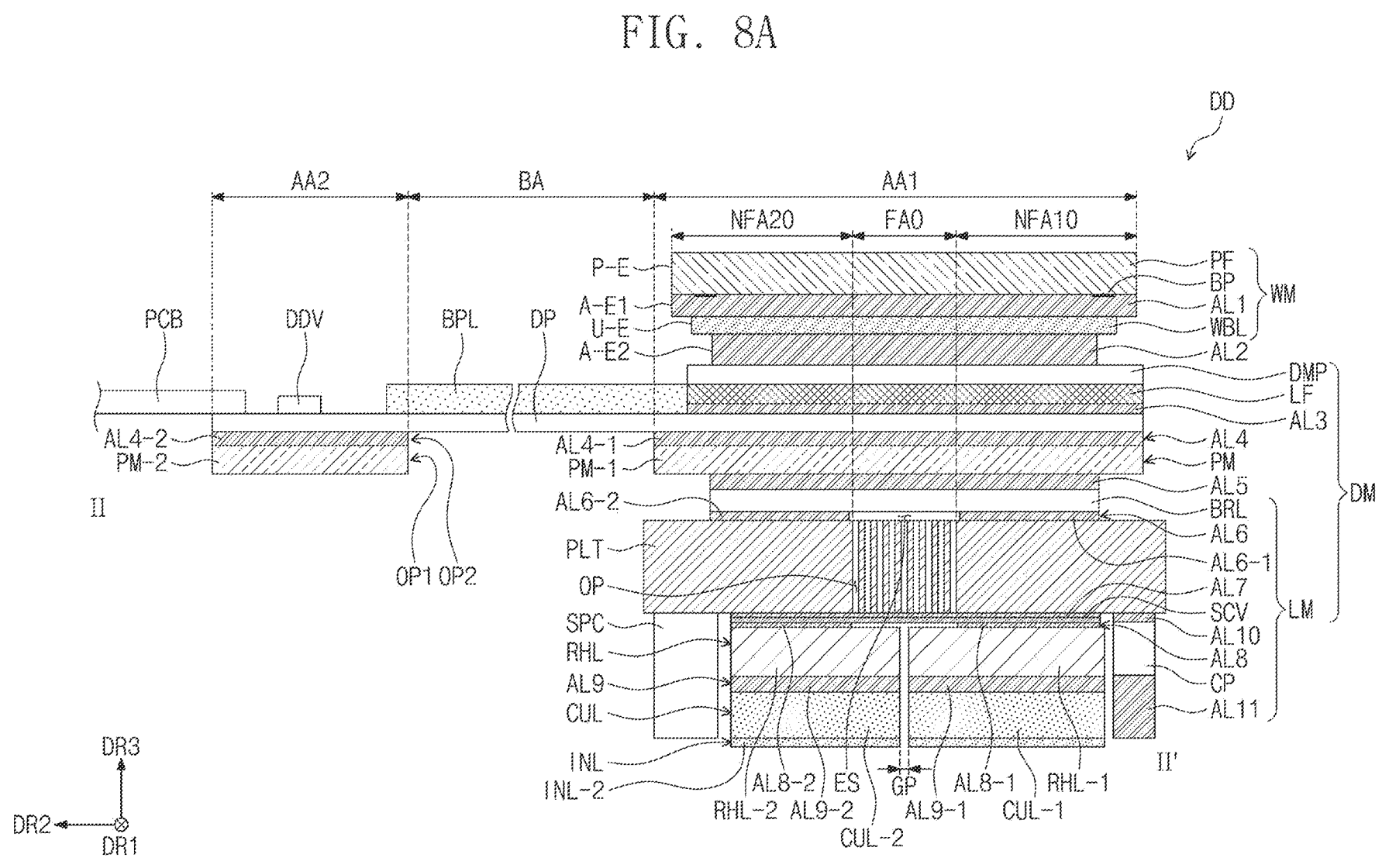
Figure 8B:
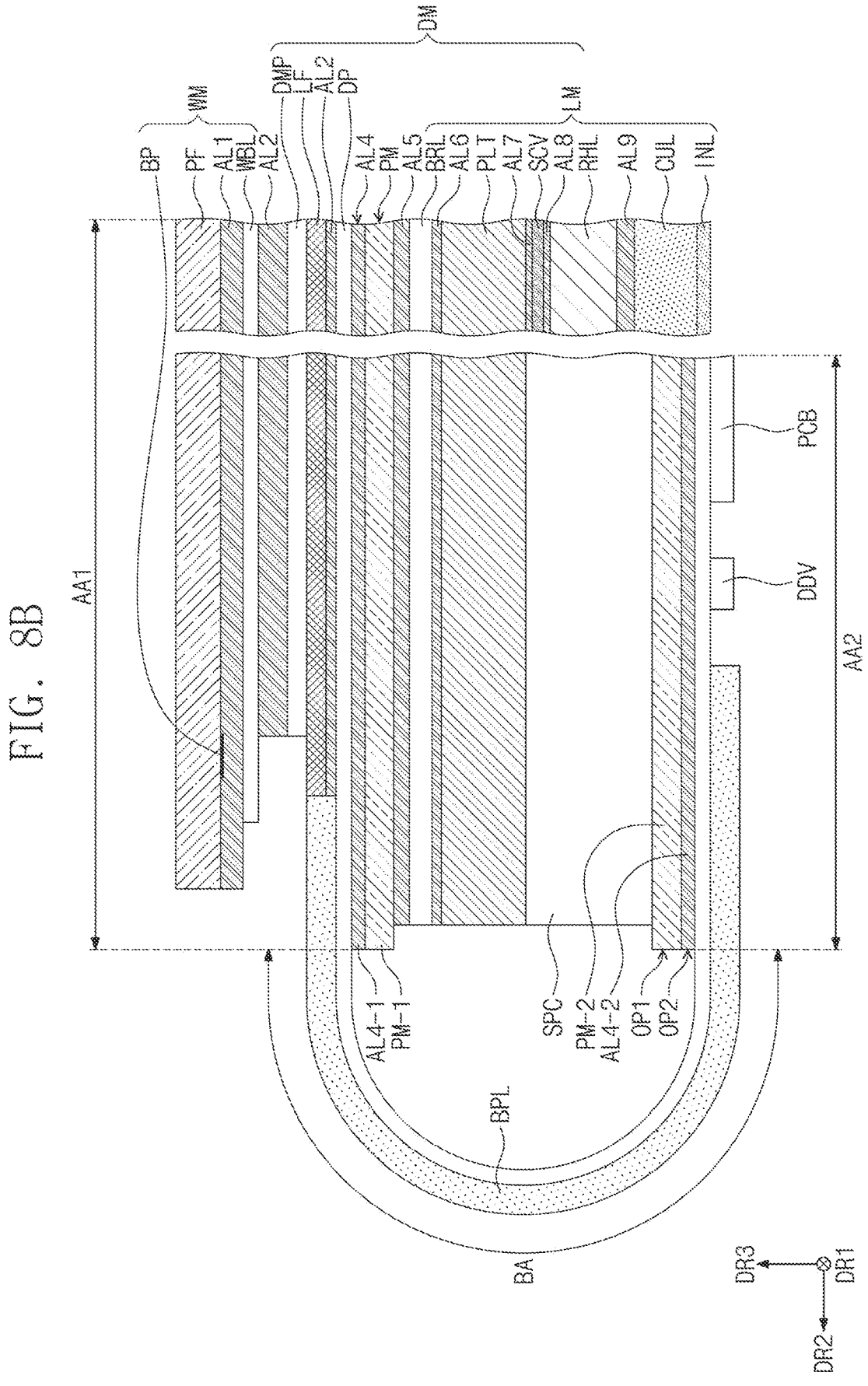
FIG. 8B is a cross-sectional view showing a state in which a display device is bent according to an embodiment of the present disclosure.

FIG. 8A is a cross-sectional view showing a state in which a display device is unfolded according to an embodiment of the present disclosure. FIG. 8B is a cross-sectional view showing a state in which a display device is bent according to an embodiment of the present disclosure. FIG. 8A is a cross-sectional view corresponding to the line II-II' of FIG. 5. FIG. 8B shows a portion of the cross-sectional view of FIG. 8A, in which the bending region BA of FIG. 8A is bent.

FIG. 8A is a view of a display panel DP in an unfolded state before being bent, and in the unfolded state of the display device DD as shown in FIG. 3A, the first region AA1 and the second region AA2 of the display panel DP are disposed at (e.g., in or on) different planes from each other as shown in FIG. 8B. The bending shape of the bending region BA will be described in more detail below with reference to FIG. 8B.

Referring to FIGS. 8A and 8B, the display device DD includes a window module (e.g., a window) WM and a display module (e.g., a display or a touch-display) DM.

The window module WM may include a window base layer WBL, a window protective layer PF disposed on the window base layer WBL, and a bezel pattern BP disposed on a lower surface of the window protective layer PF. In the present embodiment, the window protective layer PF may include a plastic film. The window module WM may further include an adhesive layer AL1 (hereinafter, referred to as a first adhesive layer) for bonding the window protective layer PF and the window base layer WBL to each other.

The bezel pattern BP may overlap with the non-display region DP-NDA (e.g., refer to FIG. 5) of the display panel DP. The bezel pattern BP may be disposed on one surface of the window base layer WBL, or on one surface of the window protective layer PF. FIG. 8A shows, as an example, that the bezel pattern BP is disposed on the lower surface of the window protective layer PF. However, the present disclosure is not limited thereto, and the bezel pattern BP may be disposed on an upper surface of the window protective layer PF. The bezel pattern BP is a colored light-shielding film, and may be formed, for example, through a coating method. The bezel pattern BP may include a base material, and a dye or a pigment mixed with the base material. The bezel pattern BP may have a closed line shape when viewed on a plane (e.g., in a plan view).

When viewed on a plane (e.g., in a plan view), an edge U-E of the window base layer WBL may not overlap with the bezel pattern BP. As the above-described conditions are satisfied, the edge U-E of the window base layer WBL is exposed from the bezel pattern BP, and fine cracks that may be generated at the edge U-E of the window base layer WBL may be inspected through an inspection device. For example, the edge U-E of the window base layer WBL may be photographed from the upper surface of the window protective layer PF through an inspection device, such as a microscope, to determine if cracks starting from the edge U-E of the window base layer WBL are generated. However, the present disclosure is not limited thereto, and the bezel pattern BP may overlap with the edge U-E of the window base layer WBL as needed or desired.

The window base layer WBL may include a glass substrate or a plastic substrate. For example, the window base layer WBL may be a plastic substrate including polyimide, polycarbonate, or polyethylene terephthalate. As another example, the window base layer WBL may be chemically strengthened glass. When the window base layer WBL is chemically strengthened glass, the window base layer WBL may have a thickness of about 15 μm to about 45 μm. The window base layer WBL may minimize or reduce the generation of wrinkles, even when folding and unfolding operations are repeated.

The window base layer WBL may have a thickness of about 50 μm to about 80 μm. The window base layer WBL may include polyimide, polycarbonate, polyamide, triacetylcellulose, polymethylmethacrylate, or polyethylene terephthalate. In some embodiments, at least one of a hard coating layer, an anti-fingerprint layer, or an anti-reflection layer may be disposed on the upper surface of the window protective layer PF.

The first adhesive layer AL1 may be a layer including a transparent adhesive material, such as a pressure sensitive adhesive (PSA), an optically clear adhesive (OCA), or an optically clear resin (OCR). The adhesive layer may include a conventional adhesive or a gluing agent, and will be described in more detail below.

The first adhesive layer AL1 may have a thickness of about 20 μm to about 50 μm, and for example, may have a thickness of about 35 μm. The first adhesive layer AL1 may be thick enough to cover the bezel pattern BP. For example, the bezel pattern BP may have a thickness of about 3 μm to about 8 μm, and the first adhesive layer AL1 may be thick enough to prevent or substantially prevent bubbles from being generated around the bezel pattern BP.

The first adhesive layer AL1 may be separated from the window base layer WBL. The window protective layer PF may have a lower strength than that of the window base layer WBL, thereby having a relatively greater chance of scratches being caused. Thus, after the first adhesive layer AL1 and the window protective layer PF are separated from the window base layer WBL, a new window protective layer PF may be bonded to the window base layer WBL.

When viewed on a plane (e.g., in a plan view), an edge P-E of the window protective layer PF and an edge A-E1 of the first adhesive layer AL1 may be aligned with each other. The window protective layer PF and the first adhesive layer AL1 may have the same or substantially the same size of an area and shape as each other.

The window module WM and the display module DM may be bonded to each other through the second adhesive layer AL2. The second adhesive layer AL2 may include a transparent adhesive, such as a pressure sensitive adhesive or an optically transparent adhesive. The second adhesive layer AL2 may have a thickness of about 35 μm to about 65 μm, and for example, may have a thickness of about 50 μm.

When viewed on a plane (e.g., in a plan view), an edge A-E2 of the second adhesive layer AL2 may overlap with the window module WM. For example, the edge A-E2 of the second adhesive layer AL2 may overlap with the window base layer WBL. In the process of bonding the window module WM and the display module DM to each other, pressure may be applied to the second adhesive layer AL2. The second adhesive layer AL2 may extend in a direction parallel to or substantially parallel to the first and second directions DR1 and DR2 under the pressure. In this case, an area of the second adhesive layer AL2 may be smaller than an area of the window base layer WBL to prevent or substantially prevent the second adhesive layer AL2 from protruding further than the window base layer WBL.

When the first adhesive layer AL1 and the second adhesive layer AL2 are bonded to each other, the window base layer WBL may fail to slip upon folding of the display device DD, and thus, buckling and cracking may be caused in the window base layer WBL. However, according to an embodiment of the present disclosure, because the area of the second adhesive layer AL2 is smaller than the area of the window base layer WBL, the first adhesive layer AL1 and the second adhesive layer AL2 may not be bonded to each other, and there may be a lower chance of foreign substances adhering to the second adhesive layer AL2.

In some embodiments, the window module WM may include a plastic resin layer disposed directly on the upper surface of the window base layer WBL. The plastic resin layer in contact with the upper surface of the window base layer WBL may be formed using an insert molding method. Before the forming of the plastic resin layer, the bezel pattern BP may be formed on the upper surface of the window base layer WBL. Accordingly, the plastic resin layer may cover the bezel pattern BP.

In some embodiments, a hard coating layer may be disposed on the window protective layer PF. The hard coating layer may be disposed on an outermost surface of the display device DD, and may serve as a functional layer to improve use characteristics of the display device DD. For example, the hard coating layer may enhance anti-finger-print, anti-pollution, and scratch-resistant characteristics.

The display module DM includes a shock absorbing layer DMP, an anti-reflection layer LF, a display panel DP, a panel protective member PM, and a support member LM. The support member LM may include a barrier layer BRL, a support layer PLT, a cover layer SCV, a heat dissipation layer RHL, a cushion layer CUL, an insulating layer INL, a spacer SPC, and a step compensation pattern CP. The display module DM may include third to eleventh adhesive layers AL3 to AL11. The third to eleventh adhesive layers AL3 to AL11 may include an adhesive, such as a pressure sensitive adhesive or an optically transparent adhesive. In an embodiment of the present disclosure, some of the above-described components may be omitted as needed or desired. For example, the step compensation pattern CP, and the tenth and eleventh adhesive layers AL10 and AL11 associated therewith, may be omitted. Further, in some embodiments, an input sensor IS may be further disposed between the display panel DP and the anti-reflection layer LF as shown in FIG. 7.

The shock absorbing layer DMP may be disposed on the display panel DP to protect the display panel DP from external shocks. Impact resistance of the display panel DP may be improved through the shock absorbing layer DMP. In more detail, impact strength may be reduced in a structure in which the anti-reflection layer LF includes the plurality of color filters 320 and the partition layer 310 (e.g., see FIG. 7), but because the shock absorbing layer DMP is included, the impact strength may be increased, and accordingly, the impact resistance of the display panel DP may be improved. The second adhesive layer AL2 may bond the shock absorbing layer DMP and the window module WM to each other.

The anti-reflection layer LF may be bonded to the display panel DP through the third adhesive layer AL3. The third adhesive layer AL3 may have a thickness of about 20 μm to about 70 μm, for example, such as about 50 μm, but the thickness of the third adhesive layer AL3 is not limited thereto.

In an embodiment of the present disclosure, the third adhesive layer AL3 may be omitted as needed or desired, and in this case, the anti-reflection layer LF may be directly disposed on the display panel DP. In this case, a separate adhesive layer may not be disposed between the anti-reflection layer LF and the display panel DP.

The driving circuit DDV may be disposed at (e.g., in or on) the second region AA2 of the display panel DP. The driving circuit DDV may be mounted on the second region AA2 of the display panel DP. The display device DD may include a plurality of connection lines connecting the display panel DP and the driving circuit DDV to each other.

A printed circuit board PCB may be connected to the display panel DP. For example, the printed circuit board PCB may be connected to one side of the second region AA2 of the display panel DP. The printed circuit board PCB may include a base layer, and a timing controller disposed on the base layer. The timing controller may be formed as an integrated circuit chip, and mounted on an upper surface of the base layer. A portion of the printed circuit board PCB may be spaced apart from the driving circuit DDV when viewed on a plane (e.g., in a plan view), and disposed at (e.g., in or on) the second region AA2. The driving circuit DDV may be disposed between the printed circuit board PCB and the anti-reflection layer LF when viewed on a plane (e.g., in a plan view).

Referring to FIGS. 8A and 8B, as the bending region BA of the display panel DP is bent, the second region AA2 may be disposed below (e.g., underneath) the first region AA1. Accordingly, the driving circuit DDV and the printed circuit board PCB may be disposed below (e.g., underneath) the first region AA1. The driving circuit DDV and the printed circuit board PCB may be disposed below the support layer PLT. A lower surface of the base layer included in the printed circuit board PCB may be disposed to face a lower surface of the support layer PLT.

The display device DD may include a bending protective layer BPL disposed on the display panel DP. The bending protective layer BPL may be disposed between the display panel DP and the printed circuit board PCB. The bending protective layer BPL may serve to relieve stress generated upon the bending of the display panel DP.

The bending protective layer BPL may be disposed at (e.g., in or on) the bending region BA. The bending protective layer BPL may extend to the second region AA2, and be disposed at (e.g., in or on) a portion of the second region AA2 adjacent to the bending region BA. The bending protective layer BPL may be spaced apart from the driving circuit DDV. One side of the bending protective layer BPL adjacent to the first region AA1 may face the shock absorbing layer DMP adjacent to the bending region BA, one side of the anti-reflection layer LF, and one side of the third adhesive layer AL3 adjacent to the bending region BA. The bending protective layer BPL may include an acrylic resin or a urethane-based resin.

The bending protective layer BPL may protect the bending region BA. The bending protective layer BPL may cover lines disposed at (e.g., in or on) the bending region BA to protect the lines. When the bending region BA is bent, cracks in the bending region BA may be prevented or substantially prevented by supplementing a rigidity of the bending region BA by the bending protective layer BPL. The bending protective layer BPL may protect the bending region BA from external shocks.

In some embodiments, the display device DD may further include a spacer overlapping with the driving circuit DDV when the display panel DP is bent. The spacer may prevent or substantially prevent a deterioration by dissipating heat generated from the driving circuit DDV upon the operation of the display device DD.

The bending protective layer BPL may have a thickness of about 500 μm or less. For example, the bending protective layer BPL may have a thickness of about 10 μm to about 200 μm. When the thickness of the bending protective layer BPL satisfies the above range, durability and flexibility are secured without an excessive increase in the total thickness of the bending protective layer BPL, and accordingly, a display device DD having further improved mechanical reliability may be obtainable.

The panel protective member PM is disposed below (e.g., underneath) the display panel DP. The panel protective member PM may protect a lower portion of the display panel DP. The panel protective member PM may prevent or substantially prevent scratches from being generated on the rear surface of the display panel DP upon a manufacturing process of the display device DD. The panel protective member PM may be formed from the mother glass protective film MPF described above (e.g., see FIG. 1A). For example, the panel protective member PM may correspond to the panel protective film PPL of the mother glass protective film MPF described above (e.g., see FIG. 1A). The panel protective member PM will be described in more detail below.

In an embodiment of the present disclosure, the panel protective member PM may not overlap with the bending region BA. In other words, the panel protective member PM may not be disposed below (e.g., underneath) the bending region BA of the display panel DP. The panel protective member PM may include a first protective member PM-1 corresponding to the first region AA1 of the display panel DP, and a second protective member PM-2 corresponding to the second region AA2 of the display panel DP. The first protective member PM-1 may be disposed below (e.g., underneath) the first region AA1 of the display panel DP. The second protective member PM-2 may be disposed below (e.g., underneath) the second region AA2 of the display panel DP.

A first opening OP1 may be defined in (e.g., may penetrate) the panel protective member PM. The first opening OP1 of the panel protective member PM may correspond to the first opening OP1 of the panel protective film PPL shown in FIG. 1A. The first opening OP1 may overlap with the bending region BA. A width of the first opening OP1 in the second direction DR2 may be equal to or substantially equal to a width of the bending region BA in the second direction DR2. However, the present disclosure is not limited thereto, and a width of the first opening OP1 in the second direction DR2 may be different from a width of the bending region BA in the second direction DR2. A width of the first opening OP1 in the second direction DR2 may be greater than or smaller than a width of the bending region BA in the second direction DR2.

The panel protective member PM may include a flexible plastic material. For example, the panel protective member PM may include at least one of polyimide (PI) or polyethylene terephthalate (PET). The panel protective member PM may be formed of any one of polyimide (PI) and/or polyethylene terephthalate (PET). However, the material of the panel protective member PM is not limited thereto.

As shown in FIG. 8B, when the bending region BA is bent, the second protective member PM-2 may be disposed below (e.g., underneath) the first region AA1 and the first protective member PM-1, along with the second region AA2. As the bending region BA of the display panel DP is bent, the first region AA1 and the second region AA2 may be disposed at (e.g., in or on) different planes from each other. When the bending region BA is bent, the driving circuit DDV disposed at (e.g., in or on) the second region AA2 may be disposed below (e.g., underneath) the first region AA1. The panel protective member PM is not disposed at (e.g., in or on) the bending region BA, and thus, the bending region BA may be more easily bent.

The fourth adhesive layer AL4 may be disposed below (e.g., underneath) the display panel DP. The fourth adhesive layer AL4 may bond the panel protective member PM and the display panel DP to each other. The fourth adhesive layer AL4 may be formed from the mother glass protective film MPF described above (e.g., see FIG. 1A). For example, the fourth adhesive layer AL4 may correspond to the adhesive layer AFL of the mother glass protective film MPF described above (e.g., see FIG. 1A).

The fourth adhesive layer AL4 may include a first portion AL4-1 corresponding to the first protective member PM-1, and a second portion AL4-2 corresponding to the second protective member PM-2. The first portion AL4-1 may bond the first protective member PM-1 to the first region AA1 of the display panel DP, and the second portion AL4-2 may bond the second protective member PM-2 to the second region AA2 of the display panel DP.

A second opening OP2 may be defined in (e.g., may penetrate) the fourth adhesive layer AL4. The second opening OP2 of the fourth adhesive layer AL4 may correspond to the second opening OP2 of the adhesive layer AFL shown in FIG. 1A. The second opening OP2 defined in the fourth adhesive layer AL4 may overlap with the bending region BA. The second opening OP2 defined in the fourth adhesive layer AL4 may overlap with the first opening OP1 of the panel protective member PM. A width of the second opening OP2 in the second direction DR2 may be equal to or substantially equal to a width of the bending region BA in the second direction DR2. However, the present disclosure is not limited thereto, and a width of the second opening OP2 in the second direction DR2 may be different from a width of the bending region BA in the second direction DR2.

The barrier layer BRL may be disposed below (e.g., underneath) the panel protective member PM. The fifth adhesive layer AL5 may be disposed between the panel protective member PM and the barrier layer BRL, to bond the barrier layer BRL to the panel protective member PM. The fifth adhesive layer AL5 may be bonded to an upper surface of the barrier layer BRL, and the fifth adhesive layer AL5 may be referred to as an upper adhesive layer.

The barrier layer BRL may increase a resistance against a compressive force caused by external pressing. Accordingly, the barrier layer BRL may serve to prevent or substantially prevent the deformation of the display panel DP. The barrier layer BRL may include a flexible plastic material, such as polyimide or polyethylene terephthalate.

In addition, the barrier layer BRL may absorb light incident from the outside. The barrier layer BRL may include a light blocking material or a colored film having low light transmittance. For example, the barrier layer BRL may be a black plastic film, and may be, for example, a black polyimide film. When the display module DM is viewed from an upper side of the window module WM, components disposed below (e.g., underneath) the barrier layer BRL may not be viewed by users.

The support layer PLT is disposed below (e.g., underneath) the barrier layer BRL. The support layer PLT may include a suitable material having an elastic modulus of about 60 GPa or greater. The support layer PLT may include a metal material, such as stainless steel. For example, the support layer PLT may include SUS 304, but the present disclosure is not limited thereto, and the support layer PLT may include various suitable metal materials. The support layer PLT may support the display panel DP. In addition, the support layer PLT may improve heat dissipation performance of the display device DD.

A plurality of openings OP may be defined in a portion of the support layer PLT corresponding to the folding region FA0. The openings OP may improve flexibility of the support layer PLT.

An area of the barrier layer BRL may be smaller than an area of the support layer PLT. The areas may be areas when viewed on a plane (e.g., in a plan view). When viewed on a plane (e.g., in a plan view), the barrier layer BRL may overlap with a portion of the support layer PLT. Another portion of the support layer PLT may not overlap with the barrier layer BRL.

The sixth adhesive layer AL6 may be disposed between the barrier layer BRL and the support layer PLT. The sixth adhesive layer AL6 may bond the barrier layer BRL and the support layer PLT to each other. The sixth adhesive layer AL6 (hereinafter, referred to as a barrier adhesive layer) may include a first portion AL6-1 (hereinafter, referred to as a first barrier portion) and a second portion AL6-2 (hereinafter referred to as a second barrier portion), which are spaced apart from each other.

The first barrier portion AL6-1 and the second barrier portion AL6-2 may be spaced apart from each other with the plurality of openings OP therebetween. When viewed on a plane (e.g., in a plan view), the barrier adhesive layer AL6 may not overlap with the plurality of openings OP. In addition, when viewed on a plane (e.g., in a plan view), the barrier adhesive layer AL6 may be spaced apart from the plurality of openings OP.

The first barrier portion AL6-1 may overlap with the first non-folding region NFA10, the second barrier portion AL6-2 may overlap with the second non-folding region NFA20, and the first barrier portion AL6-1 and the second barrier portion AL6-2 may each not overlap with the folding region FA0. The barrier adhesive layer AL6 is not disposed in a region corresponding to the folding region FA0, and accordingly, flexibility of the support layer PLT may be improved.

In a region overlapping with the folding region FA0, the barrier layer BRL may be spaced apart from the support layer PLT. In other words, an empty space ES may be defined between the support layer PLT and the barrier layer BRL at a portion overlapping with the folding region FA0. Air may be disposed in the empty space ES.

When the display device DD is folded, the empty space ES is defined between the barrier layer BRL and the support layer PLT, and accordingly, the shape of the plurality of openings OP defined in the support layer PLT may not be viewed from the outside of the display device DD.

In addition, as the barrier layer BRL includes a light blocking material, or is applied as a colored film having a low light transmittance, a color difference of the support layer PLT may not be viewed from the outside. For example, in the support layer PLT, a color difference between the first support region in which the plurality of openings OP are defined and the second support region in which the plurality of openings OP are not defined may not be viewed from the outside. The first support region may be a region overlapping with the folding region FA0, and the second support region may be a region overlapping with the first non-folding region NFA10 and the second non-folding region NFA20.

A thickness of the barrier adhesive layer AL6 may be smaller than a thickness of the fifth adhesive layer AL5. For example, the thickness of the fifth adhesive layer AL5 may be about 25 μm, and the thickness of the barrier adhesive layer AL6 may be about 16 μm.

As the thickness of the barrier adhesive layer AL6 decreases, a step difference due to the barrier adhesive layer AL6 may be reduced. As the step difference is smaller, shape deformation of stacked structures, which may be caused by folding and unfolding of the display device DD, may be less likely to take place, but the plurality of openings OP may be viewed or the barrier adhesive layer AL6 may be separated due to repeated folding operations. As the thickness of the barrier adhesive layer AL6 increases, the plurality of openings OP may not be viewed, and the barrier adhesive layer AL6 has greater reliability in an adhesive force against repeated folding operations, but the step difference may increase. Accordingly, the thickness of the barrier adhesive layer AL6 may be selected within a suitable range in consideration of folding reliability, adhesion reliability, and visibility of the plurality of openings OP.

The seventh adhesive layer AL7 (hereinafter, referred to as a first cover adhesive layer) may be disposed below (e.g., underneath) the support layer PLT, and the cover layer SCV may be disposed below (e.g., underneath) the first cover adhesive layer AL7. The support layer PLT and the cover layer SCV may be bonded to each other through the first cover adhesive layer AL7. The cover layer SCV may be manufactured in the form of a sheet, and bonded to the support layer PLT.

The first cover adhesive layer AL7 and the cover layer SCV may cover the plurality of openings OP defined in the support layer PLT. Accordingly, the cover layer SCV may prevent or substantially prevent foreign substances from being introduced into the plurality of openings OP. The cover layer SCV may have a lower elastic modulus than that of the support layer PLT. For example, the cover layer SCV may include thermoplastic polyurethane, rubber, or silicone, but the present disclosure is not limited thereto.

The eighth adhesive layer AL8 (hereinafter, referred to as a second cover adhesive layer) may be disposed below the cover layer SCV. The second cover adhesive layer AL8 may include a first cover portion AL8-1 and a second cover portion AL8-2. The first cover portion AL8-1 and the second cover portion AL8-2 may be spaced apart from each other. When viewed on a plane (e.g., in a plan view), the first cover portion AL8-1 and the second cover portion AL8-2 may be spaced apart from each other with the plurality of openings OP therebetween. The first cover portion AL8-1 and the second cover portion AL8-2 may not overlap with the folding region FA0.

The heat dissipation layer RHL may be disposed below (e.g., underneath) the second cover adhesive layer AL8. The heat dissipation layer RHL may be a sheet having high thermal conductivity. The heat dissipation layer RHL may include a metal or a metal alloy, and for example, the heat dissipation layer RHL may include copper, a copper alloy, or graphite.

The heat dissipation layer RHL may include a first heat dissipation layer RHL-1 and a second heat dissipation layer RHL-2. The first heat dissipation layer RHL-1 and the second heat dissipation layer RHL-2 may be spaced apart from each other by a distance (e.g., a predetermined distance) GP. The distance GP may be about 0.4 mm (millimeter) to about 2.4 mm, but is not particularly limited thereto. The distance GP may be disposed to correspond to the folding region FA0.

The first heat dissipation layer RHL-1 may be bonded to the cover layer SCV through the first cover portion AL8-1, and the second heat dissipation layer RHL-2 may be bonded to the cover layer SCV through the second cover portion AL8-2. When viewed on a plane (e.g., in a plan view), the first heat dissipation layer RHL-1 may overlap with a portion of the folding region FA0 and the first non-folding region NFA10, and the second heat dissipation layer RHL-2 may overlap with another portion of the folding region FA0 and the second non-folding region NFA20.

When viewed on a plane (e.g., in a plan view), a portion of the first heat dissipation layer RHL-1 may overlap with a portion of the plurality of openings OP, and a portion of the second heat dissipation layer RHL-2 may overlap with another portion of the plurality of openings OP. The first heat dissipation layer RHL-1 and the second heat dissipation layer RHL-2 may serve to support the support layer PLT. For example, a region in which the plurality of openings OP of the support layer PLT are defined may be supported by the first heat dissipation layer RHL-1 and the second heat dissipation layer RHL-2. Accordingly, the first heat dissipation layer RHL-1 and the second heat dissipation layer RHL-2 may be referred to as a first lower support layer and a second lower support layer.

The ninth adhesive layer AL9 may be disposed below (e.g., underneath) the heat dissipation layer RHL. The ninth adhesive layer AL9 may include a first portion AL9-1 corresponding to the first heat dissipation layer RHL-1, and a second portion AL9-2 corresponding to the second heat dissipation layer RHL-2. The first portion AL9-1 and the second portion AL9-2 may be spaced apart from each other by the predetermined distance GP.

The cushion layer CUL may be disposed below the ninth adhesive layer AL9. The cushion layer CUL may have a thickness of about 75 μm, but is not particularly limited thereto. The cushion layer CUL may absorb external shocks to protect the display panel DP. The cushion layer CUL has a lower elastic modulus than that of the support layer PLT. The cushion layer CUL may include a foam sheet having a suitable elastic force (e.g., a predetermined elastic force). The cushion layer CUL may include a sponge or polyure-thane.

The cushion layer CUL may include a first cushion layer CUL-1 corresponding to the first portion AL9-1, and a second cushion layer CUL-2 corresponding to the second portion AL9-2. The first cushion layer CUL-1 and the second cushion layer CUL-2 may be spaced apart from each other by the predetermined distance GP. When viewed on a plane (e.g., in a plan view), the distance GP between the first cushion layer CUL-1 and the second cushion layer CUL-2 may overlap with the folding region FA0. When viewed on a plane (e.g., in a plan view), the first cushion layer CUL-1 may overlap with a portion of the folding region FA0 and the first non-folding region NFA10, and the second cushion layer CUL-2 may overlap with another portion of the folding region FA0 and the second non-folding region NFA20.

Unlike an embodiment of the present disclosure, in a case where the cushion layer CUL is disposed between the support layer PLT and the display panel DP, when the display panel DP is pressed, the shape of the cushion layer CUL may be deformed, so that the display panel DP may be easily deformed. However, according to an embodiment of the present disclosure, the cushion layer CUL is spaced apart from the display panel DP with the support layer PLT therebetween. Accordingly, when the display panel DP is pressed, the deformation of the display panel DP may be less likely to occur. In addition, as the cushion layer CUL is disposed below (e.g., underneath) the heat dissipation layer RHL that is firmly supported, shock absorption performance of the cushion layer CUL may be improved. An insulating layer INL may be disposed below the cushion layer CUL. The insulating layer INL may be, for example, an insulating tape. The insulating layer INL may prevent or substantially prevent inflow of static electricity. In some embodiments, a flexible circuit film may be disposed on the insulating layer INL. The insulating layer INL may prevent or substantially prevent electrical interference between the flexible circuit film and members disposed on the insulating layer INL.

One surface of the step compensation pattern CP may be bonded to the support layer PLT through the tenth adhesive layer AL10. The eleventh adhesive layer AL11 is disposed on another surface of the step difference compensation pattern CP.

Referring to FIG. 8B, the bending region BA may be bent, such that the second region AA2 is disposed below (e.g., underneath) the first region AA1. Accordingly, the driving circuit DDV may be disposed at (e.g., in or on) the first region AA1. In other words, the first region AA1 and the second region AA2 are disposed at (e.g., in or on) different planes (e.g., reference planes). The bending region BA may be bent to be horizontally convex on a cross-section. The bending region BA has a suitable curvature (e.g., a prede-termined curvature), and a suitable radius (e.g., a predeter-mined radius) of curvature. The radius of curvature may be about 0.1 mm to 0.5 mm.

The bending protective layer BPL is disposed at least at (e.g., in or on) the bending region BA. The bending protec-tive layer BPL may be disposed at (e.g., in or on) a portion of the first region AA1 and a portion of the second region AA2, as well as at (e.g., in or on) the bending region BA. The bending protective layer BPL may overlap with the bending region BA, the first region AA1, and the second region AA2.

The bending protective layer BPL may be bent along with the bending region BA. The bending protective layer BPL protects the bending region BA from external shocks, and controls a neutral plane of the bending region BA. The bending protective layer BPL controls stress in the bending region BA to make the neutral plane close to signal lines disposed at (e.g., in or on) the bending region BA.

The spacer SPC may be disposed between the support layer PLT and the second protective member PM-2. Although the spacer SPC is shown as a single layer in FIGS. 8A and 8B, the spacer SPC may have a multi-layered structure in which a base layer is disposed between two adhesive layers. The base layer may include graphite having excellent heat dissipation properties. One side of the support layer PLT and one side of the spacer SPC may be aligned with one side of the barrier layer BRL, but the present disclosure is not limited thereto, and they may not be aligned with each other.

The spacer SPC may be a double-sided tape. For example, the spacer SPC may include a base layer, such as polyeth-ylene terephthalate having flexibility, and an adhesive dis-posed on upper and lower surfaces of the base layer. A space between the support layer PLT and the second protective member PM-2 is spaced apart by the spacer SPC, and thus, the bending region BA may maintain or substantially main-tain a suitable curvature (e.g., a predetermined curvature).

Hereinafter, a method for manufacturing a display device according to an embodiment of the present disclosure will be described in more detail. Hereinafter, the same reference symbols are used to describe the same or substantially the same components as the components described above, and thus, redundant description thereof may not be repeated.

Figure 9:
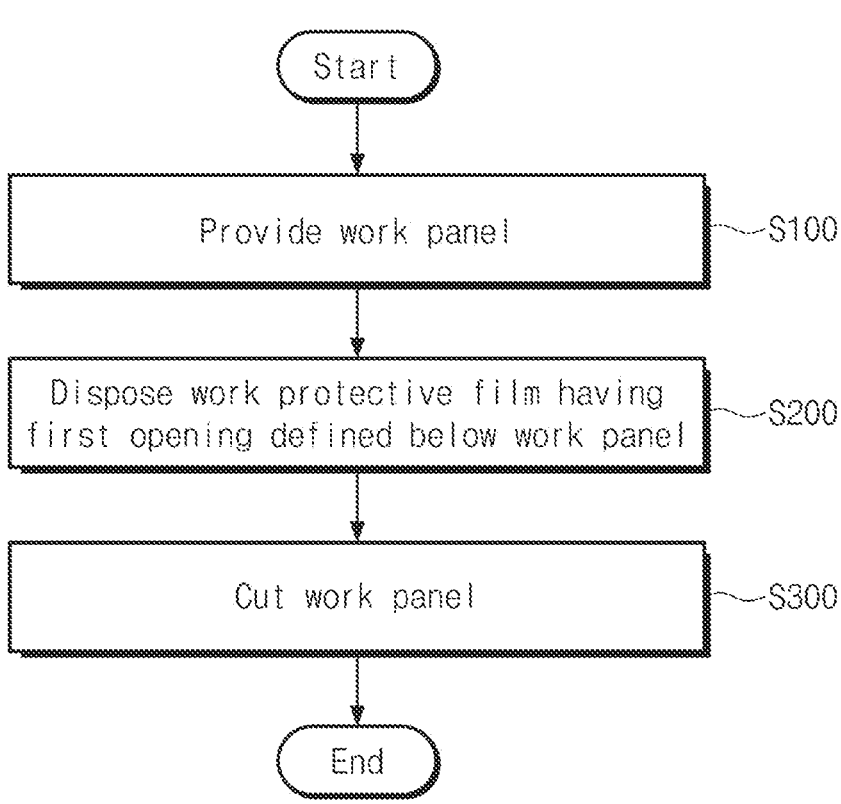
FIG. 9 is a flow diagram of a method for manufacturing a display device according to an embodiment of the present disclosure.

FIG. 9 is a flow diagram of a method for manufacturing a display device according to an embodiment of the present disclosure. FIGS. 10A through 10G are views showing a method for manufacturing a display device according to an embodiment of the present disclosure. FIGS. 10A through 10G sequentially show the method for manufacturing a display device according to an embodiment of the present disclosure. In FIGS. 10A through 10G, an embodiment in which the mother glass protective film MPF shown in FIG. 1A is used is illustrated. However, the present disclosure is not limited thereto, and the mother glass protective film MPF shown in FIG. 2 may be used in the method for manufacturing a display device, which will be described in more detail below.

Referring to FIG. 9, the method for manufacturing a display device according to an embodiment of the present disclosure may include providing a work panel (S100), disposing a work protective film having a first opening defined below the work panel (S200), and cutting the work panel (S300).

Figure 10A:
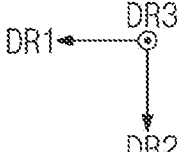
FIGS. 10A-10G are views showing a method for manufacturing a display device according to an embodiment of the present disclosure.

Referring to FIG. 10A, the method for manufacturing a display device according to an embodiment may include providing a work panel WP. The work panel WP may include a plurality of cell regions CA, and a peripheral region EA adjacent to the plurality of cell regions CA. The work panel WP may include the plurality of cell regions CA, which are sections in which a plurality of display panels DP (e.g., see FIG. are formed, and the peripheral region EA, which is a portion other than the sections. The plurality of display panels DP formed on the work panel WP may be concurrently provided with each other through the same process.

The plurality of cell regions CA may be disposed to be spaced apart from each other along the first direction DR1 and/or the second direction DR2. Although FIG. 10A shows that three-by-three cell regions CA are spaced apart from each other in each of the first and second directions DR1 and DR2, the present disclosure is not limited thereto. For example, the work panel WP may include a greater number of cell regions CA, and the cell regions CA may be disposed along any one of the first direction DR1 and/or the second direction DR2, and are not limited to any particular embodiment.

Each of the plurality of cell regions CA may be separated to form some components of the display device DD (e.g., see FIG. 3A). The display panel DP (e.g., see FIG. 5) may be included in a portion of the display device DD (e.g., see FIG. 3A) formed by separating the cell regions CA of the work panel WP. As another example, a portion of the display device DD (e.g., see FIG. 3A) formed by separating the cell regions CA of the work panel WP may include the display panel DP (e.g., see FIG. 5), and may further include at least one of the input sensor IS or the anti-reflection layer LF (e.g., see FIG. 7), in addition to the display panel DP.

Each of the plurality of cell regions CA may include the first region AA1, the bending region BA, and the second region AA2 defined along the second direction DR2. The first region AA1 of the plurality of cell regions CA may correspond to the first region AA1 of the display panel DP (e.g., see FIG. 5). The bending region BA of the plurality of cell regions CA may correspond to the bending region BA of the display panel DP (e.g., see FIG. 5). The second region AA2 of the plurality of cell regions CA may correspond to the second region AA2 of the display panel DP (e.g., see FIG. 5). The work panel WP may be in a state in which components included in the display panel DP (e.g., see FIG. 5) are manufactured for each cell region CA.

The work panel WP may include the peripheral region EA adjacent to the plurality of cell regions CA. The peripheral region EA may be a boundary region between the plurality of cell regions CA. The peripheral region EA may surround (e.g., around peripheries of) each of the plurality of cell regions CA, and each cell region CA may be connected through the peripheral region EA.

Although FIG. 10A shows, as an example, that the work panel WP includes a plurality of cell regions CA arranged along the first direction DR1 and the second direction DR2, the number and shape of the plurality of cell regions CA included in the work panel WP may be variously modified according to the shape of a display panel to be manufactured.

Figure 10B:
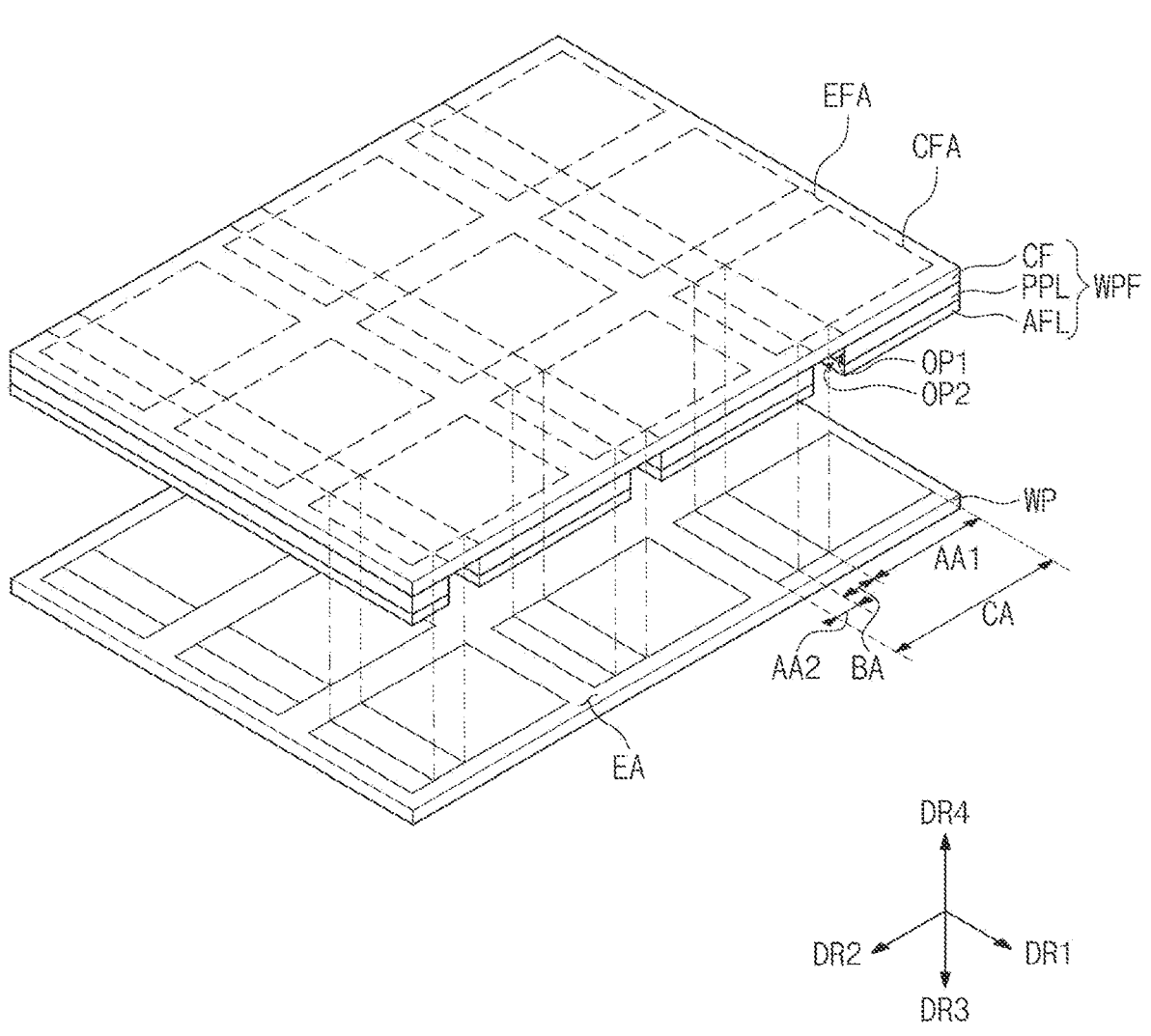
Figure 10C:
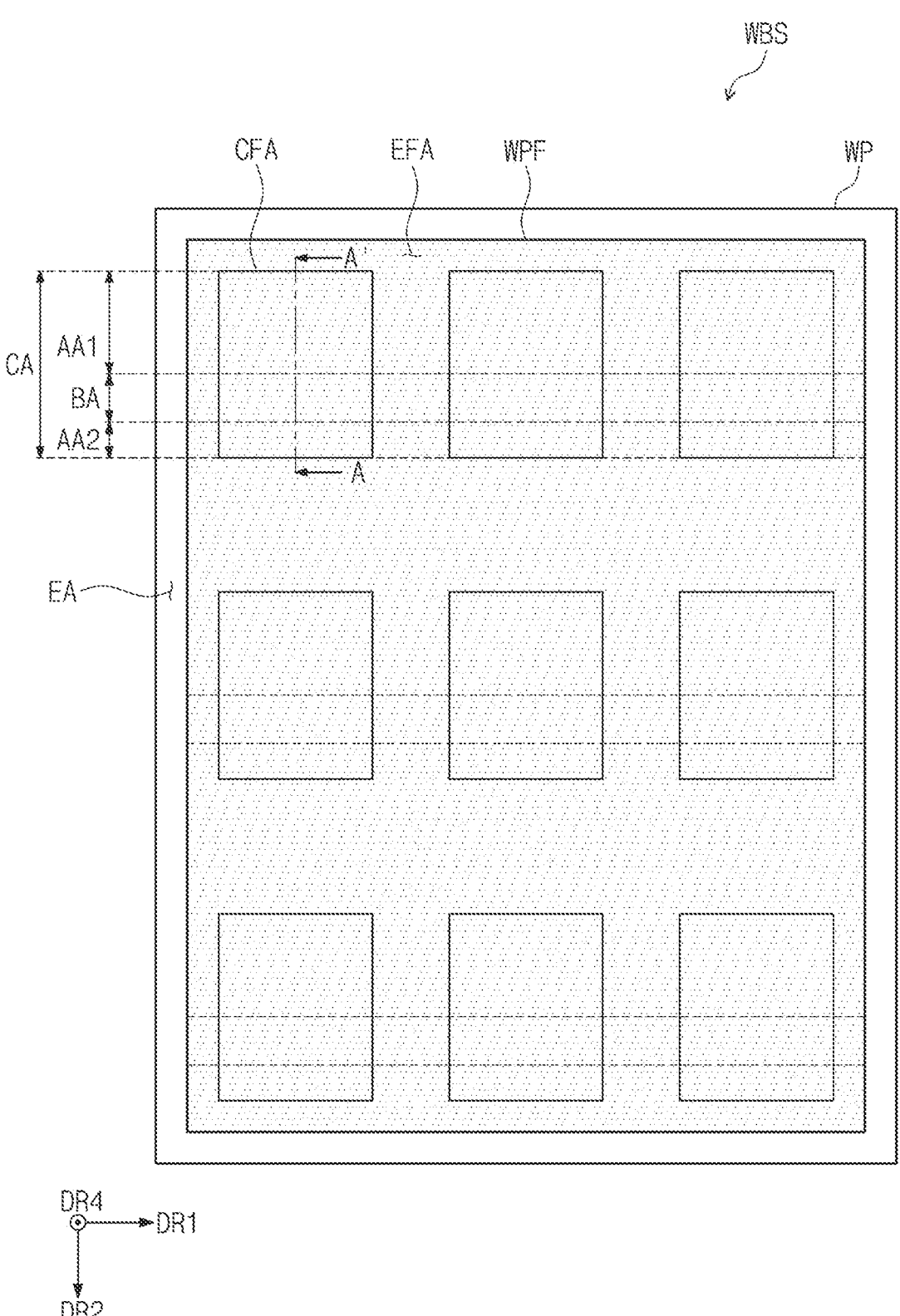
Figure 10D:
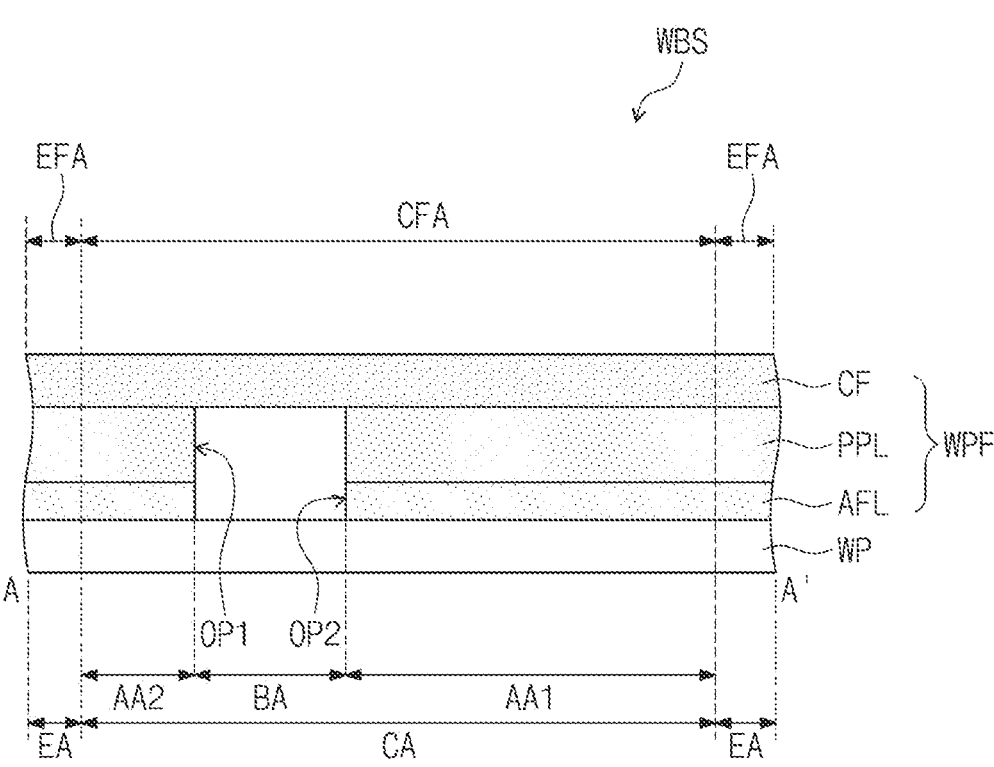
Figure 10D:
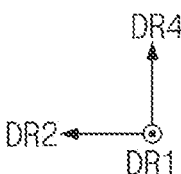

FIGS. 10B to 10D are views showing disposing a work protective film below a work panel according to an embodiment of the present disclosure. FIG. 10D is a cross-sectional view showing a portion corresponding to the line A-A' of FIG. 10C.

Referring to FIGS. 10B through 10D, the work protective film WPF may be bonded below (e.g., underneath) the work panel WP. Upper and lower sides of the work panel WP shown in FIG. 10A may be inverted, such that a rear surface of the work panel WP faces upward. The work protective film WPF may be bonded to the rear surface of the work panel WP. Accordingly, a work substrate WBS, in which the work protective film WPF is bonded to the work panel WP, may be formed.

Each of the plurality of display panels DP formed on the work panel WP may include the base layer BL, the circuit element layer DP-CL disposed on the base layer BL, the light emitting element layer DP-EL, and the thin film encapsulation layer TFE (e.g., see FIG. 7). In addition, the work panel WP may further include functional layers, such as the input sensor IS and the anti-reflection layer LF (e.g., see FIG. 7), in addition to the plurality of display panels DP. As the work protective film WPF is bonded to the rear surface of the work panel WP, the work protective film WPF may be disposed to be adjacent to a lower surface of the base layer BL (e.g., see FIG. 6) of the display panel DP.

The work protective film WPF may include the carrier film CF, the panel protective film PPL, and the adhesive layer AFL. The work protective film WPF may be obtained by removing the temporary protective film TF from the mother glass protective film MPF shown in FIG. 1A. The temporary protective film TF may be removed to expose the adhesive layer AFL to the outside. The work protective film WPF may have a state in which the temporary protective film TF is removed from the mother glass protective film MPF shown in FIG. 1A, to expose an upper surface of the adhesive layer AFL. The work protective film WPF may be bonded to the work panel WP through the adhesive layer AFL.

The work protective film WPF may be bonded below (e.g., underneath) the work panel WP to protect the plurality of cell regions CA. The work panel WP is a state in which the display panel DP (e.g., see FIG. 5) is manufactured for each of the plurality of cell regions CA, and the work protective film WPF may be bonded to the work panel WP to protect each of the plurality of cell regions CA.

In some embodiments, an upper protective film may be further disposed on the work panel WP. The upper protective film may be disposed on the work panel WP, and bonded to an upper portion of the work panel WP to protect the plurality of cell regions CA. However, the present disclosure is not limited thereto, and the upper protective film may be omitted as needed or desired.

Although FIG. 10C shows that a planar area of the work protective film WPF is smaller than a planar area of the work panel WP, the present disclosure is not limited thereto. For example, the planar area of the work protective film WPF may be equal to or substantially equal to the planar area of the work panel WP, or may be larger than the planar area of the work panel WP.

The work protective film WPF may include the plurality of cell film regions CFA, and the connection region EFA adjacent to the plurality of cell film regions CFA. The connection region EFA may surround (e.g., around peripheries of) the plurality of cell film regions CFA. The work protective film WPF according to an embodiment may include the plurality of cell film regions CFA corresponding to each of the plurality of cell regions CA included in the work panel WP. In the work protective film WPF, the plurality of cell film regions CFA may be optionally set to overlap with the plurality of cell regions CA. In the disposing of the work protective film WPF below the work panel WP, the work protective film WPF may be provided such that the plurality of cell film regions CFA overlap with the plurality of cell regions CA.

The plurality of cell film regions CFA may include a first portion corresponding to the first region AA1 of the plurality of cell regions CA, a second portion corresponding to the second region AA2 of the plurality of cell regions CA, and a bending portion corresponding to the bending region BA of the plurality of cell regions CA. When the work protective film WPF is disposed below the work panel WP, the first portion, the bending portion, and the second portion of the plurality of cell film regions CFA may be disposed to overlap with the first region AA1, the bending region BA, and the second region AA2 of the plurality of cell regions CA. The first portion, the bending portion, and the second portion of the plurality of cell film regions CFA may be disposed below (e.g., underneath) the first region AA1, the bending region BA, and the second region AA2 of the plurality of cell regions CA.

The carrier film CF may be a component to protect the plurality of cell regions CA in a subsequent process. The carrier film CF may be disposed on the panel protective film PPL to protect the components disposed on the panel protective film PPL during a process. For example, the carrier film CF may serve to prevent or substantially prevent damage that may be caused to the display panel DP due to movement or the like during a process. For example, the carrier film CF may include an insulating film. The carrier film CF may have a plate shape extending in the first direction DR1 and the second direction DR2. The carrier film CF may be removed from a final product. In other words, the carrier film CF may not remain in the final display device DD (e.g., see FIG. 3A), because the carrier film CF is removed in the subsequent process.

The panel protective film PPL may be disposed on the carrier film CF. The panel protective film PPL may remain in the final display device DD (e.g., see FIG. 3A). The panel protective film PPL may remain bonded to a lower portion of the display panel DP (e.g., see FIG. 8A) in the display device DD. The panel protective film PPL may be cut along a cutting line TL (e.g., see FIG. 10E) in a process of cutting the work panel WP, which will be described in more detail below, to form the panel protective member PM shown in FIG. 8A.

A first opening OP1 overlapping with at least the plurality of cell film regions CFA may be defined in the panel protective film PPL. The first opening OP1 may be a pattern formed in the panel protective film PPL to overlap with the bending region BA of the plurality of cell regions CA. A shape of the first opening OP1 may be set according to a shape of the bending region BA. For example, a width of the first opening OP1 in the second direction DR2 may be set to be equal to or substantially equal to a width of the bending region BA in the second direction DR2. In an embodiment, the panel protective film PPL may be disposed on the work panel WP, such that the first opening OP1 overlaps with the bending region BA of the work panel WP.

The first opening OP1 may extend in the first direction DR1. The panel protective film PPL may include one end and another end that are spaced apart from each other along the first direction DR1, and the first opening OP1 may have a shape extending from the one end to the other end of the panel protective film PPL. When viewed on a plane (e.g., in a plan view), an area of the first opening OP1 may be greater than an area of the bending region BA of the work panel WP. As the first opening OP1 has the shape extending from the one end to the other end of the panel protective film PPL, a planar area of the first opening OP1 may be greater than a planar area of the bending region BA.

When the mother glass protective film MPF shown in FIG. 2 is used in the method for manufacturing a display device according to an embodiment, the planar area of the first opening OP1 may be equal to or substantially equal to the planar area of the bending region BA. When the work protective film WPF shown in FIG. 2 is disposed on the work panel WP, each of the plurality of cell openings COP1, COP2, and COP3 may be disposed to overlap with the bending region BA of the corresponding cell region CA from among the plurality of cell regions CA. In this case, a planar area of the plurality of cell openings COP1, COP2, and COP3 may be equal to or substantially equal to a planar area of the bending region BA. However, the present disclosure is not limited thereto, and the planar area of the plurality of cell openings COP1, COP2, and COP3 may be larger than or smaller than the planar area of the bending region BA.

The adhesive layer AFL may be disposed on the panel protective film PPL. In the disposing of the work protective film WPF below the work panel WP, the adhesive layer AFL and the work panel WP may contact each other. The upper surface of the adhesive layer AFL may contact the lower surface of the work panel WP.

A second opening OP2 corresponding to the first opening OP1 may be defined in the adhesive layer AFL. A width of the second opening OP2 in the second direction DR2 may be equal to or substantially equal to a width of the first opening OP1 in the second direction DR2. A planar area of the second opening OP2 may be equal to or substantially equal to a planar area of the first opening OP1. However, the present disclosure is not limited thereto, and the planar area of the second opening OP2 may be different from the planar area of the first opening OP1. In an embodiment, the adhesive layer AFL may be disposed on the work panel WP, such that the second opening OP2 overlaps with the bending region BA of the work panel WP.

Referring to FIG. 10D, an empty space overlapping with the bending region BA may be formed between the carrier film CF and the work panel WP. When the work protective film WPF is bonded to the work panel WP, the empty space may be formed in portions corresponding to the first opening OP1 and the second opening OP2. The empty space between the carrier film CF and the work panel WP may be formed through the first opening OP1 and the second opening OP2. A thickness of the empty space in the third direction DR3 may be equal to or substantially equal to the sum of thicknesses of the panel protective film PPL and the adhesive layer AFL in the third direction DR3. In a subsequent process, the carrier film CF may be removed, and the first opening OP1 and the second opening OP2 may be exposed to the outside.

Figure 10E:
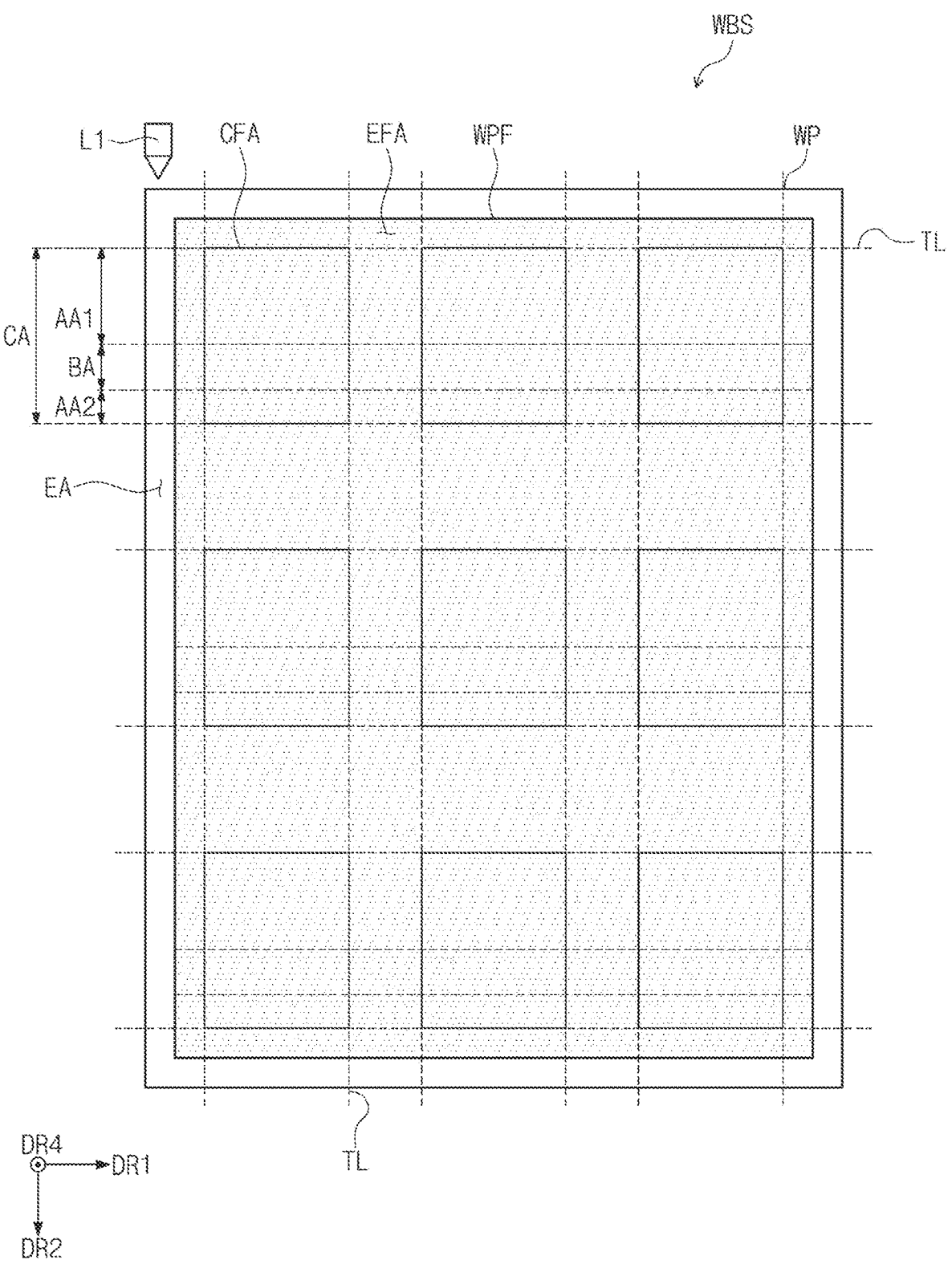
Figure 10F:
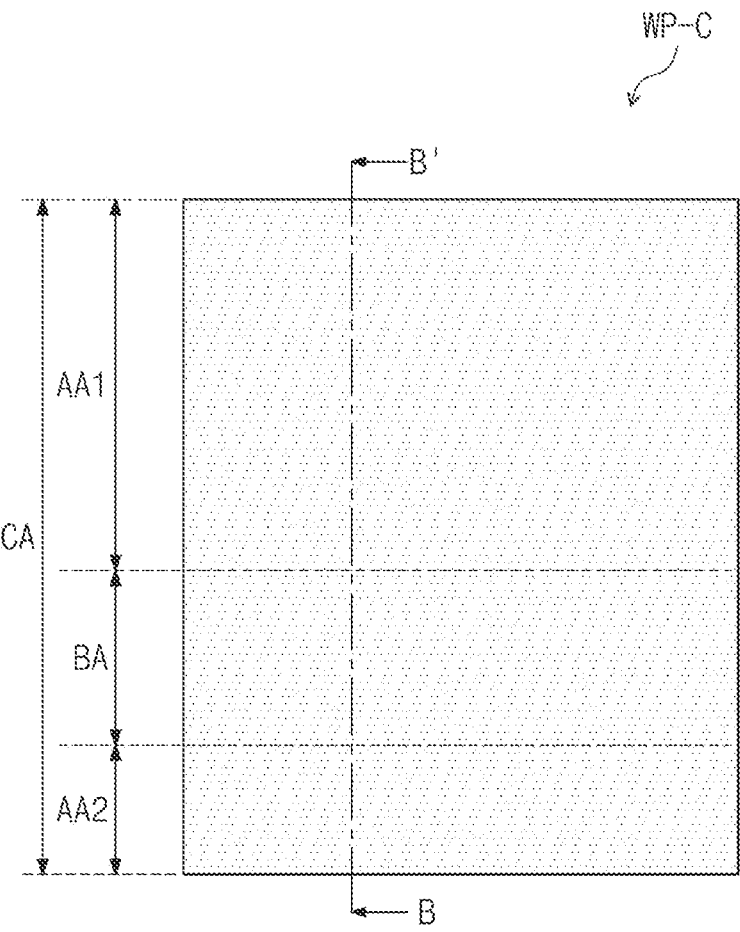
Figure 10F:
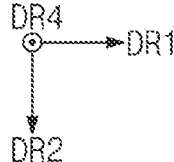
Figure 10G:
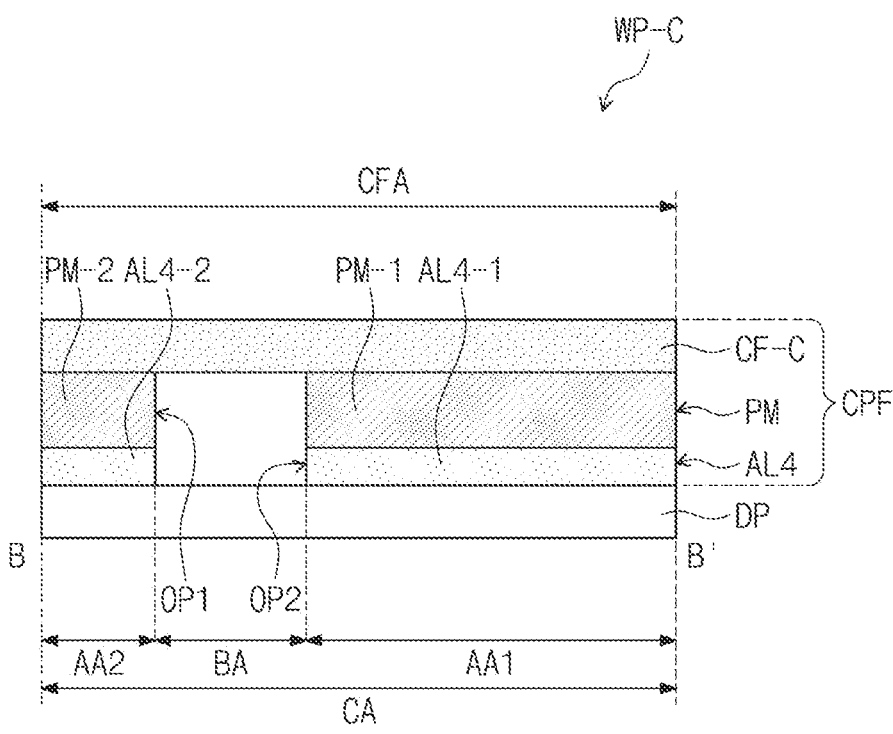
Figure 10G:
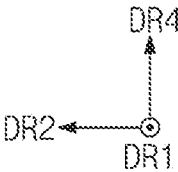

Referring to FIGS. 10E through 10G, the method for manufacturing a display device according to an embodiment may include cutting the work panel WP. The cutting of the work panel WP may separate individual panels WP-C from the work panel WP.

The cutting line TL may be set between the plurality of cell regions CA and the peripheral region EA. The cutting line TL may correspond to a boundary between the plurality of cell regions CA and the peripheral region EA. The cutting line TL may be set to correspond to an outer boundary of the plurality of cell regions CA.

The cutting of the work panel WP may be performed using a first device L1. The first device L1 may cut the work panel WP while moving in the first direction DR1 and the second direction DR2 along the cutting line TL. Accordingly, the display panels formed on the work panel WP may be separated into individual display panels DP. The first device L1 may cut the work panel WP through laser irradiation. The first device L1 may emit lasers having various intensities.

The first device L1 may cut the work substrate WBS to be separated into a plurality of panels WP-C. As shown in FIG. 10G, each of the plurality of panels WP-C may include the display panel DP, and a cell protective film CPF overlapping with the display panel DP when viewed on a plane (e.g., in a plan view), and bonded to a lower portion of the display panel DP. The separation into individual panels WP-C may be performed in a way that the first device L1 emits a laser along the cutting line TL, while moving on the work substrate WBS in the first direction DR1 and the second direction DR2 to pass through the work substrate WBS. Accordingly, the work protective film WPF and the work panel WP may be cut along the cutting line TL.

After the cutting of the work panel WP, the plurality of panels WP-C corresponding to the plurality of cell regions CA may be formed. FIGS. 10F and 10G show, as an example, one panel WP-C corresponding to one cell region CA. The panel WP-C may include the display panel DP formed in the cell region CA. The panel WP-C may include the cell protective film CPF corresponding to the cell film region CFA. The cell protective film CPF may be bonded to the lower portion of the display panel DP included in the panel WP-C.

The cell protective film CPF may include a cell carrier film CF-C, a panel protective member PM, and a fourth adhesive layer AL4. The cell carrier film CF-C may be formed by cutting the work protective film WPF along the cutting line TL. The panel protective member PM may be formed by cutting the panel protective film PPL from the work protective film WPF along the cutting line TL. The panel protective member PM shown in FIG. 10G may correspond to the panel protective member PM shown in FIG. 8A. The fourth adhesive layer AL4 may be formed by cutting the adhesive layer AFL from the work protective film WPF along the cutting line TL. The fourth adhesive layer AL4 shown in FIG. 10G may correspond to the fourth adhesive layer AL4 shown in FIG. 8A.

The fourth adhesive layer AL4 may be disposed below the display panel DP. The fourth adhesive layer AL4 may not overlap with the bending region BA of the display panel DP. A second opening OP2 overlapping with the bending region BA may be defined in the fourth adhesive layer AL4. The fourth adhesive layer AL4 may include a first portion AL4-1 overlapping with the first region AA1 of the display panel DP, and a second portion AL4-2 overlapping with the second region AA2 of the display panel DP. The first portion AL4-1 may be disposed below (e.g., underneath) the first region AA1 of the display panel DP, and the second portion AL4-2 may be disposed below (e.g., underneath) the second region AA2 of the display panel DP. The first portion AL4-1 may be in contact with the lower surface of the display panel DP corresponding to the first region AA1, and the second portion AL4-2 may be in contact with the lower surface of the display panel DP corresponding to the second region AA2.

The panel protective member PM may be disposed below (e.g., underneath) the display panel DP. The panel protective member PM may not overlap with the bending region BA of the display panel DP. A first opening OP1 overlapping with the bending region BA may be defined in the panel protective member PM. The panel protective member PM may include a first protective member PM-1 overlapping with the first region AA1, and a second protective member PM-2 overlapping with the second region AA2. The first protective member PM-1 may be disposed below the first region AA1 of the display panel DP, and the second protective member PM-2 may be disposed below the second region AA2 of the display panel DP. The first protective member PM-1 may be bonded to the display panel DP through the first portion AL4-1 of the fourth adhesive layer AL4. The second protective member PM-2 may be bonded to the display panel DP through the second portion AL4-2 of the fourth adhesive layer AL4.

The cell carrier film CF-C may be disposed below (e.g., underneath) the panel protective member PM. The cell carrier film CF-C may be disposed on a lower surface of the panel protective member PM. The cell carrier film CF-C may cover the lower surface of the panel protective member PM. The cell carrier film CF-C may cover the entire lower surface of the panel protective member PM.

The cell carrier film CF-C may be separated from the panel WP-C, and a lower structure may be further disposed below (e.g., underneath) the display panel DP. The lower structure may be at least one of the functional layers included in the support member LM shown in FIG. 8A. In addition, an upper structure may be disposed on the display panel DP. The upper structure may be at least one of the anti-reflection layer LF, the impact absorption layer DMP, or the window module WM shown in FIG. 8A.

According to an embodiment of the present disclosure, a plurality of display panels DP may be formed by patterning the work panel WP. However, the present disclosure is not limited thereto, and in another embodiment of the present disclosure, one display panel DP may be provided from the work panel WP according to a desired size of the display panel DP.

The display device according to an embodiment is manufactured through the work protective film WPF in which the first opening OP1 is defined to overlap with at least the plurality of cell film regions CFA, thereby shortening process time and reducing process costs. As the panel protective film PPL is provided to the work panel WP after a portion corresponding to the bending region BA of the display device DD is removed, the display device DD may have increased efficiency in the process.

In the case of a display device DD including the bending region BA, the panel protective member PM may not be disposed at (e.g., in or on) the bending region BA of the display panel DP, such that stress generated when the bending region BA is bent may be minimized or reduced. In a comparative example, display devices have been manufactured by removing a panel protective member disposed in a bending region in the process of manufacturing a display device in mother glass. For example, a process of bonding a panel protective film in mother glass to a work panel in mother glass and removing a portion corresponding to a bending region of a display panel from a panel protective member has been performed. In other words, display devices have been manufactured by bonding a panel protective member overlapping with a first region, a bending region, and a second region to a display panel, and then removing a portion of the panel protective member corresponding to the bending region. However, in this comparative example, a process of cutting and peeling the panel protective member is used to remove the panel protective member corresponding to the bending region, resulting in longer process time and lower productivity. In addition, when errors are generated in the process of cutting the panel protective member in mother glass, or when the panel protective member corresponding to the bending region is not properly removed, defects in the display devices may increase.

According to an embodiment of the present disclosure, in the process of forming the display device DD from the work panel WP in mother glass, the work protective film WPF in mother glass in which the first opening OP1 is defined may be provided. When the work protective film WPF is bonded to the work panel WP, the first opening OP1 defined in the panel protective film PPL may be disposed to overlap with the bending region BA. Accordingly, the process of cutting and peeling the panel protective film PPL corresponding to the bending region BA may be omitted. In addition, the panel protective film PPL is provided to the work panel WP in a state in which a portion corresponding to the bending region BA is removed, and thus, the defect rate in the manufacturing process may be reduced. In addition, in the work protective film WPF according to an embodiment of the present disclosure, the panel protective film PPL having the first opening OP1 defined therein and the carrier film CF are provided as a singly body, thereby greatly reducing the number of equipment used in the manufacturing process, process time, and process costs, to significantly increase productivity of the display device DD.

A mother glass protective film according to an embodiment of the present disclosure is provided to a work panel as a portion corresponding to a bending region of a display device is removed from a panel protective film, thereby increasing process efficiency of a display device.

According to a method for manufacturing a display device according to an embodiment of the present disclosure, a display device is manufactured through a work protective film in which a first opening is defined to overlap with at least a plurality of cell regions, thereby shortening process time and reducing process costs.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A mother glass protective film having a plurality of cell film regions defined along a first direction, and a connection region adjacent to the plurality of cell film regions, the mother glass protective film comprising:
   a carrier film; and
   a panel protective film on the carrier film, and having a first opening overlapping with at least the plurality of cell film regions,
   wherein the panel protective film comprises a first end, and a second end spaced from the first end in the first direction with the plurality of cell film regions between the first end and the second end, and
   wherein the first opening extends from the first end to the second end across the plurality of cell film regions.

2. The mother glass protective film of claim 1, wherein the carrier film covers a lower surface of the panel protective film.

3. The mother glass protective film of claim 1, wherein the first opening extends in the first direction.

4. The mother glass protective film of claim 1, wherein the first opening has a width of 0.5 mm to 2 mm in a second direction crossing the first direction.

5. The mother glass protective film of claim 1, wherein a depth of the first opening is equal to a thickness of the panel protective film.

6. The mother glass protective film of claim 1, wherein the carrier film and the panel protective film each independently comprises at least one of polyimide or polyethylene terephthalate.

7. The mother glass protective film of claim 1, further comprising an adhesive layer on the panel protective film.

8. The mother glass protective film of claim 7, wherein the adhesive layer has a second opening corresponding to the first opening.

9. The mother glass protective film of claim 1, wherein carrier film has a plate shape that is parallel to the first direction, and a second direction crossing the first direction.

10. A mother glass protective film comprising:
    a carrier film;
    a panel protective film on the carrier film, and having at least one first opening extending in a first direction; and
    an adhesive layer on the panel protective film, and having a second opening corresponding to the first opening,
    wherein the panel protective film comprises a first end, and a second end spaced from the first end in the first direction with a plurality of cell film regions between the first end and the second end, and
    wherein the first opening extends from the first end to the second end across the plurality of cell film regions.

11. A method for manufacturing a display device, comprising:
    providing a work panel comprising:
       a plurality of cell regions arranged along a first direction, each of the cell regions including a first region, a bending region, and a second region sequentially defined along a second direction crossing the first direction; and
       a peripheral region adjacent to the plurality of cell regions;
    disposing a work protective film below the work panel, the work protective film having a first opening extending in the first direction to commonly overlap with at least the bending region of each of the plurality of cell regions; and
    cutting the work panel along a cutting line between the plurality of cell regions and the peripheral region.

12. The method of claim 11, wherein the work protective film comprises:
    a carrier film; and
    a panel protective film on the carrier film, and having the first opening.

13. The method of claim 12, wherein the carrier film covers a lower surface of the panel protective film.

14. The method of claim 12, wherein the panel protective film comprises:
    a first end; and

39

40 a second end spaced from the first end in the first direction, and wherein the first opening extends from the first end to the second end.

15. The method of claim 12, wherein the work protective film further comprises an adhesive layer on the panel protective film, and wherein, in the disposing of the work protective film, the work panel and the adhesive layer are in contact with each other.

16. The method of claim 15, wherein the adhesive layer has a second opening corresponding to the first opening.

* * * * *